(12) United States Patent
　　Wang et al.

(10) Patent No.: US 10,672,934 B2
(45) Date of Patent: Jun. 2, 2020

(54) SPAD IMAGE SENSOR AND ASSOCIATED FABRICATING METHOD

(71) Applicant: TAIWAN SEMICONDUCTOR MANUFACTURING COMPANY LTD., Hsinchu (TW)

(72) Inventors: Tzu-Jui Wang, Kaohsiung County (TW); Jhy-Jyi Sze, Hsin-Chu (TW); Yuichiro Yamashita, Hsinchu (TW); Kuo-Chin Huang, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/873,289

(22) Filed: Jan. 17, 2018

(65) Prior Publication Data

US 2019/0131478 A1　　May 2, 2019

Related U.S. Application Data

(60) Provisional application No. 62/580,535, filed on Oct. 31, 2017.

(51) Int. Cl.
*H01L 31/107*　　(2006.01)
*H01L 27/144*　　(2006.01)
(Continued)

(52) U.S. Cl.
CPC ........ *H01L 31/107* (2013.01); *H01L 27/1463* (2013.01); *H01L 27/1464* (2013.01);
(Continued)

(58) Field of Classification Search
CPC ...... H01L 31/107; H01L 31/16; H01L 27/144
(Continued)

(56) References Cited

U.S. PATENT DOCUMENTS

| 2003/0197190 A1* | 10/2003 | Asano | H01L 21/761 |
| | | | 257/98 |
| 2007/0057147 A1* | 3/2007 | Kim | H01L 27/14601 |
| | | | 250/208.1 |

(Continued)

FOREIGN PATENT DOCUMENTS

| KR | 10-2007-0031046 | 3/2007 |
| KR | 10-0761829 | 9/2007 |
| TW | 201724488 A | 7/2017 |

OTHER PUBLICATIONS

Office Action and Search Report dated Apr. 25, 2019 by Taiwan Intellectual Property Office for counterpart application No. 107114291.

(Continued)

*Primary Examiner* — Sheng-Bai Zhu
(74) *Attorney, Agent, or Firm* — WPAT, P.C., Intellectual Property Attorneys; Anthony King

(57) ABSTRACT

A single photon avalanche diode (SPAD) image sensor is disclosed. The SPAD image sensor include: a substrate of a first conductivity type, the substrate having a front surface and a back surface; a deep trench isolation (DTI) extending from the front surface toward the back surface of the substrate, the DTI having a first surface and a second surface opposite to the first surface, the first surface being level with the front surface of the substrate; an epitaxial layer of a second conductivity type opposite to the first conductivity type, the epitaxial layer surrounding sidewalls and the second surface of the DTI; and an implant region of the first conductivity type extending from the front surface to the back surface of the substrate. An associated method for fabricating the SPAD image sensor is also disclosed.

20 Claims, 20 Drawing Sheets

(51) Int. Cl.
  *H01L 31/16* (2006.01)
  *H01L 27/146* (2006.01)
  *H01L 31/02* (2006.01)
(52) U.S. Cl.
  CPC .. *H01L 27/14634* (2013.01); *H01L 27/14645* (2013.01); *H01L 27/14647* (2013.01); *H01L 27/14689* (2013.01); *H01L 31/02027* (2013.01); *H01L 27/1462* (2013.01)
(58) Field of Classification Search
  USPC .................... 257/292, 288, 375; 438/400
  See application file for complete search history.

(56) References Cited

U.S. PATENT DOCUMENTS

| | | | | |
|---|---|---|---|---|
| 2007/0069309 | A1* | 3/2007 | Lindsay | H01L 29/105 257/408 |
| 2007/0141801 | A1* | 6/2007 | Kwon | H01L 27/1463 438/400 |
| 2008/0079045 | A1* | 4/2008 | Bahl | H01L 27/1463 257/292 |
| 2009/0315131 | A1* | 12/2009 | Hung | H01L 27/14621 257/432 |
| 2010/0019295 | A1* | 1/2010 | Henderson | H01L 31/107 257/292 |
| 2012/0205730 | A1* | 8/2012 | Chen | H01L 27/14609 257/292 |
| 2012/0273907 | A1* | 11/2012 | Lim | H01L 27/14621 257/432 |
| 2013/0193546 | A1 | 8/2013 | Webster et al. | |
| 2013/0320479 | A1* | 12/2013 | Ahn | H01L 31/02 257/460 |
| 2014/0339398 | A1* | 11/2014 | Mazzillo | H01L 31/107 250/208.2 |
| 2014/0374867 | A1* | 12/2014 | De Munck | H01L 31/03529 257/443 |
| 2016/0043119 | A1* | 2/2016 | Lee | H01L 27/1463 250/208.1 |
| 2017/0330906 | A1* | 11/2017 | Korobov | H01L 27/14605 |

OTHER PUBLICATIONS

Office Action and Search Report dated Mar. 3, 2020 issued by Korean Intellectual Property Office for counterpart application No. 10-2018-0132212.
US Patent Publication 20070057147 is the English counterpart application to Foreign Reference KR10-2007-0031046.
US Patent Publication 20070141801 is the English counterpart application to Foreign Reference KR10-0761829.

* cited by examiner

SPAD IMAGE SENSOR AND ASSOCIATED FABRICATING METHOD

CROSS REFERENCE TO RELATED APPLICATIONS

This application claims the benefit of U.S. provisional application 62/579,535, filed on Oct. 31, 2017, which is incorporated by reference in its entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are solid devices that are compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
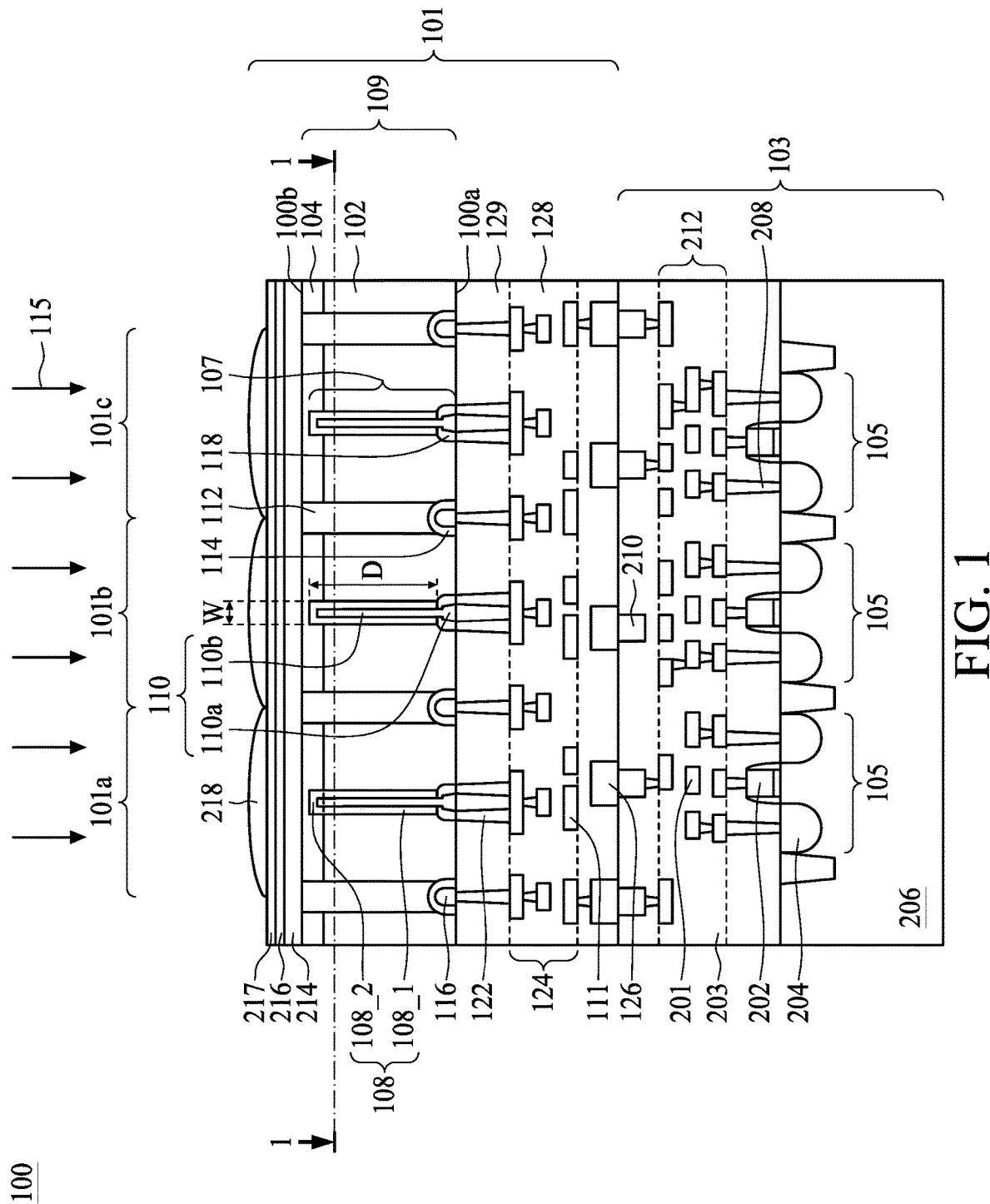
FIG. 1 is a diagram illustrating a cross-sectional view of a SPAD image sensor including a CMOS (complementary metal-oxide-semiconductor) chip and an imaging chip bonded together in accordance with a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A SPAD (single photon avalanche diode) image sensor can detect incident radiation with very low intensities (e.g., a single photon). The SPAD image sensor includes a plurality of SPAD cells arranged in an array. The SPAD cells respectively include a p-n junction, a quench circuit and a read circuit. The p-n junction operates at a reverse bias well above its breakdown voltage. During operation, photo-generated carriers move to a depletion region (i.e., a multiplication region) of the p-n junction and trigger an avalanche effect such that a signal current can be detected. The quench circuit is used to cut off the avalanche effect and reset the SPAD cell. The read circuit receives and transmits the signal current.

An existing planar SPAD image sensor is configured to include a guard ring. The guard ring consumes a large area and therefore limits the fill factor, a parameter characterizing a ratio of photodiode area to total pixel area. Also, reducing the entire area of total pixel area is hard to be achieved. In addition, incident light may be absorbed in the planar SPAD image sensor by different depths depending on a wavelength of the incident light, and the generated electrons need extra time to diffuse to a depletion region in the planar SPAD. The extra time is unpredictable and induces timing jitter. These present disclosure relates to improving the spectral response, detection efficiency and timing jitter of the existing SPAD image sensor.

The present disclosure relates to a SPAD image sensor having a vertical p-n junction structure. Compared to the existing planar SPAD image sensor having a horizontal p-n junction structure, a uniform electric field at different depth of the SPAD image sensor can be obtained. The present SPAD image sensor also provides a modified guard ring structure. The modified guard ring structure is advantageous to obtain a higher fill factor, which is an indispensable feature in small pitch applications.

FIG. 1 is a diagram illustrating a cross-sectional view of a SPAD image sensor 100 including a CMOS (complementary metal-oxide-semiconductor) chip 103 and an imaging chip 101 bonded together in accordance with a first embodiment of the present disclosure. The SPAD image sensor 100 includes an array of pixels 101a to 101c. The SPAD image sensor 100 includes the CMOS chip 103 and the imaging chip 101 bonded together. The CMOS chip 103 has a plurality of active devices 105 and the imaging chip 101 has a plurality of SPAD cells 107. In some embodiments, the CMOS chip 103 includes an interconnect structure 212 disposed over a substrate 206. In some embodiments, the interconnect structure 212 includes a plurality of metal layers 201 disposed within an inter-layer dielectric (ILD) layer 203. The active devices 105 are disposed within the substrate 206. The imaging chip 101 includes an interconnect structure 124 disposed between the interconnect structure 212 of the CMOS chip 103 and a substrate 109 of the imaging chip 101. The interconnect structure 124 includes a plurality of metal layers 111 disposed within an ILD layer 128.

The SPAD cells 107 are disposed within the substrate 109. The substrate 109 includes a front surface 100a facing the interconnect structure 124 and a back surface 100b facing opposite to the interconnect structure 124. In some embodiments, the substrate 109 includes a first layer 102 and a second layer 104 on the first layer 102. The first layer 102 may be doped with dopants of a first conductivity type, and has a dopant concentration at a level of about $1e17/cm^3$. The first layer 102 is for absorbing incident light 115. The second layer 104 may be doped with dopants of the first conductivity type, and has a dopant concentration at a level of about $1e15/cm^3$, which is lighter than the first layer 102. The second layer 104 may be used as an equivalent guard ring for electric field relaxing to prevent premature edge breakdown of the SPAD cells 107, and a thickness of the second layer 104 may be about 0.5 um. In some embodiments, the first layer 102 and the second layer 104 are p-type epitaxial layers. The SPAD cells 107 are disposed in the substrate 109 and abut a front surface 100a (also referred to as a front side) of the substrate 109. The SPAD cells 107 may extend toward a back surface 100b (also referred to as a back side) and pass through an interface between the first layer 102 and a second layer 104. In many instances, the SPAD cells 107 stop in the second layer 104 without contacting the back surface 100b of the substrate 109.

The SPAD cells 107 respectively include a deep trench isolation (DTI) 110, an epitaxial layer 108 and a heavily doped region 118. The DTI 110 is formed of a dielectric material such as an oxide (silicon oxide, for example), a nitride (silicon nitride or silicon oxynitride, for example), a low-k dielectric, and/or another suitable dielectric material. The DTI 110 includes a first potion 110a abutting the front surface 100a of the substrate 109 and a second portion 110b abutting the first potion 110a. In many instances, the first portion 110a of the DTI 110 has a width wider than the second portion 110b. In other words, sidewalls of the first portion 110a may be laterally protruding from sidewalls of the second portion 110b. The first portion 110a may be fully disposed in the first layer 102 of the substrate 109 with a surface level with the front surface 100a. The second portion 110b may be disposed across the interface between the first layer 102 and the second layer 104 and not reaching the back surface 100b. The DTI 110 is a solid pillar, and sidewalls and a bottom of the second portion 110b of the DTI 110 are surrounded by the epitaxial layer 108. The epitaxial layer 108 is doped with dopants of a second conductivity type opposite to the first conductivity type. In some embodiments, the epitaxial layer 108 is for receiving carriers with mobility less than 500 $cm^2/(V-s)$. In some embodiments, the epitaxial layer 108 is an n-type epitaxial layer doped with an n-type dopant for receiving holes.

The epitaxial layer 108 includes a main portion 108_1 and a bottom portion 108_2. The main portion 108_1 is substantially located in the first layer 102 and has a uniform dopant concentration at a level of about $1e18/cm^3$. The main portion 108_1 of the epitaxial layer 108 is configured as a sensing node to detect electrons generated in the first layer 102. The uniformity of the main portion 108_1 of the epitaxial layer 108 is particularly important for creating an environment with a uniform electric field across the depth of the first layer 102. In that way, the incident light absorbed at any depth in the first layer 102 can be sensed immediately by reducing time for carrier drift, in particular the drift time of holes. A function of the bottom portion 108_2 of the epitaxial layer 108 may be more like for electric field relaxing. In many instances, a dopant concentration in a bottom portion 108_2 of the epitaxial layer 108 in the second layer 104 may gradually decrease from the main portion 108_1 toward the back surface 100b. For example, the bottom portion 108_2 of the epitaxial layer 108 may have a dopant concentration ranging from about $1e16/cm^3$ to about $1e18/cm^3$. A depth D and a width W of the epitaxial layer 108 are not limited. A longer depth may be advantageous since incident light with different wave lengths may be absorbed at different depths. In many instances, the depth D of the epitaxial layer 108 may be ranging from about 1 um to about 30 um. The width W of the epitaxial layer 108 may be about 3 um or less.

The heavily doped region 118 is doped with dopants of the second conductivity type opposite to the first conductivity type, and a dopant concentration of the heavily doped region 118 is higher than the dopant concentration of the epitaxial layer 108. For example, the dopant concentration of the heavily doped region 118 may range from about $1e19/cm^3$ to about $1e20/cm^3$. The heavily doped region 118 functions as an electrode of the SPAD cells 107. The pixels 101a to 101c are isolated by implant regions 112. The implant region 112 may extend from the front surface 100a of the substrate 109 to the back surface 100b of the substrate 109. The implant region 112 is doped with dopants of the first conductivity type, and has a dopant concentration the same to or greater than the first layer 102. In some embodiments, a shallow well region 114 of the first conductivity type may be optionally disposed between the implant region 112 and the front surface 100a of the substrate 109. A heavily doped region 116 of the first conductivity type may be disposed in the shallow well region 114 abutting the front surface 100a of the substrate 109, and a dopant concentration of the heavily doped region 116 is higher than the dopant concentration of the implant region 112. The heavily doped region 116 functions as another electrode of the SPAD cells 107 shared by adjacent pixels.

The heavily doped regions 116 and 118 can be coupled to the plurality of metal layers 111 and further coupled to the active devices 105 of the CMOS chip 103 through the plurality of metal layers 201. In some embodiments, the active devices 105 may include active quench circuit to stop avalanche effect and reset bias of the SPAD cells 107. The active devices 105 may also include read circuit and other control or logic circuits. For example, the active devices 105 may include a transistor device having a gate structure 202 and source/drain regions 204. The heavily doped regions 116 and 118 can be coupled to a source/drain region 204 of the transistor through a contact plug 208.

In some embodiments, the imaging chip 101 and the CMOS chip 103 are bonded together by a hybrid bond including a metal-to-metal bond and a dielectric-to-dielectric bond. The metal to metal bond (e.g. a diffusion bond) can be between a top metal layer 126 of the plurality of metal layers 111 and a top metal layer 210 of the plurality of metal layers 201. The dielectric-to-dielectric bond can be between the ILD layer 128 and the ILD layer 203 such that the ILD layer 128 and the ILD layer 203 are in direct contact with one another. The top metal layers 126 and 210 function as a pair of bonding pads and can include re-distribution layers (RDLs). In some embodiments, the dielectric-to-dielectric bond is an oxide-to-oxide bond.

In some embodiments, the imaging chip 101 may as well have a plurality of active devices in peripheral regions of the substrate 109 at around the array of pixels 101a to 101c. For instance, a portion or all of the active quench circuit, the read circuit and other control or logic circuits mentioned above may be disposed in the substrate 109 of the imaging chip 101 instead of the CMOS chip 103.

In some embodiments, the SPAD image sensor 100 further includes a high-k dielectric layer 214 and/or an anti-reflective coating (ARC) layer 216 disposed over the back surface 100b of the substrate 109, configured to facilitate transmissions of the incident photons 115 from the back surface 100b to the SPAD cells 107. The SPAD image sensor 100 may further include a color filter layer 217 over the ARC layer 216. In many instances, the color filter layer 217 contains a plurality of color filters positioned such that the incoming radiation is directed thereon and therethrough. The color filters includes a dye-based (or pigment based) polymer or resin for filtering a specific wavelength band of the incoming radiation, which corresponds to a color spectrum (e.g., red, green, and blue). A micro-lens layer 218 containing a plurality of micro-lenses is formed over the color filter layer 217. The micro-lenses 218 direct and focus the incoming radiation 115 toward the SPAD cells 107. The micro-lenses 218 may be positioned in various arrangements and have various shapes depending on a refractive index of a material used for the micro-lens 218 and distance from a sensor surface. In many instances, a center of each of the micro-lenses 218 overlaps a center of each of the corresponding SPAD cells 107 from a top view.

Figure 2:
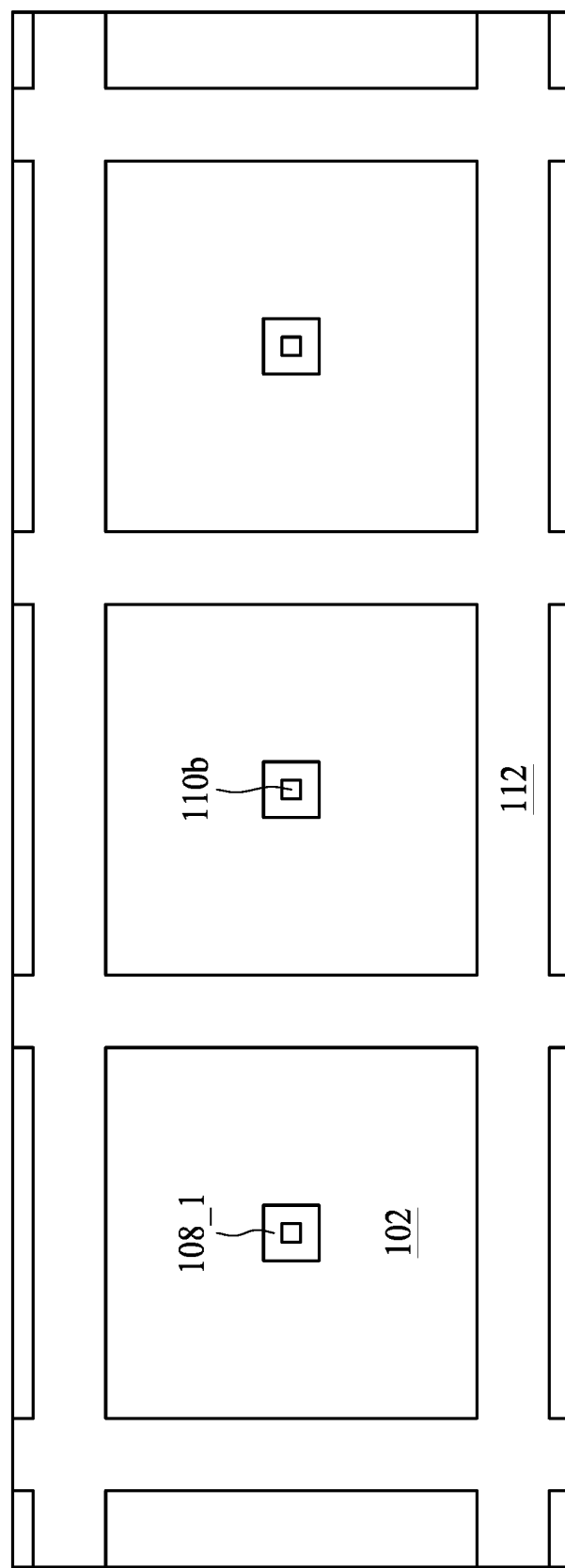
FIG. 2 is diagram illustrating a cross-sectional view of the SPAD image sensor taken along the lines 1-1 of FIG. 1.

FIG. 2 is diagram illustrating a cross-sectional view of the SPAD image sensor 100 taken along the lines 1-1 of FIG. 1. A sensing area includes regions except the implant region 112, the main portion 108_1 of the epitaxial layer 108 and the second portion 110b of the DTI 110. The fill factor is more than about 80%. The second portion 110b of the DTI 110 is in a square shape as shown in FIG. 2. However, this is not a limitation of the present disclosure. In many instances, the DTI 110 may have a rectangle, circle or octagonal shape cross-sectional view taken along the lines 1-1 of FIG. 1.

Figure 3:
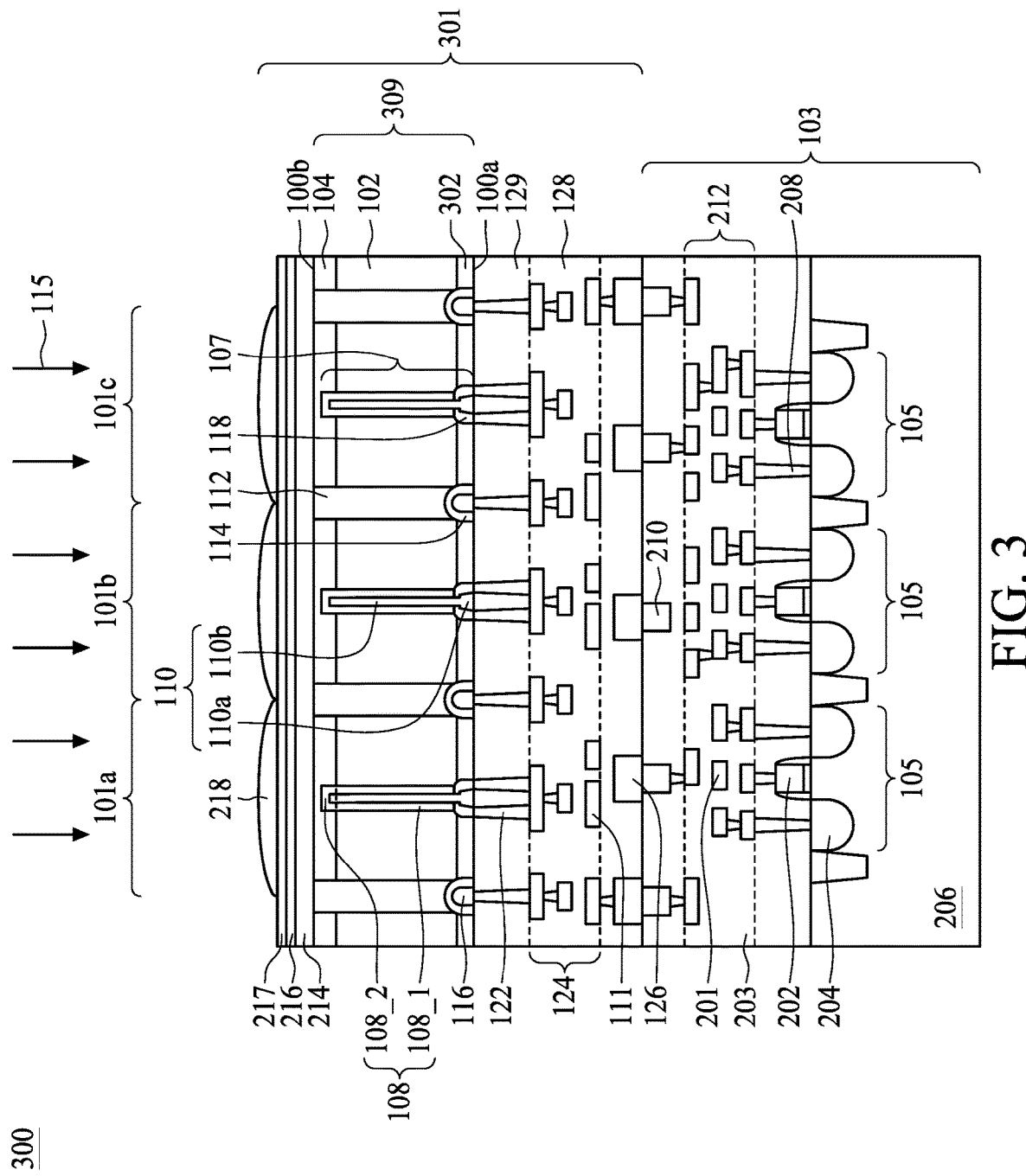
FIG. 3 is a diagram illustrating a cross-sectional view of a SPAD image sensor including a CMOS chip and an imaging chip bonded together in accordance with a second embodiment of the present disclosure.

FIG. 3 is a diagram illustrating a cross-sectional view of a SPAD image sensor 300 including the CMOS chip 103 and an imaging chip 301 bonded together in accordance with a second embodiment of the present disclosure. The imaging chip 301 is the same to the imaging chip 101 except a substrate 309 of the imaging chip 301 further includes a third layer 302. The third layer 302 is doped with dopants of the first conductivity type, and has a dopant concentration substantially the same to the second layer 104, i.e., at a level of about $1e15/cm^3$. Like the second layer 104, the third layer 302 may be used as an equivalent guard ring for electric field relaxing to prevent premature edge breakdown of the SPAD cells 107. A thickness of the third layer 302 may be about 0.5 um. In some embodiments, the third layer 302 is a p-type epitaxial layer. In some embodiments, the heavily doped region 118 is in the third layer 302.

Figure 4:
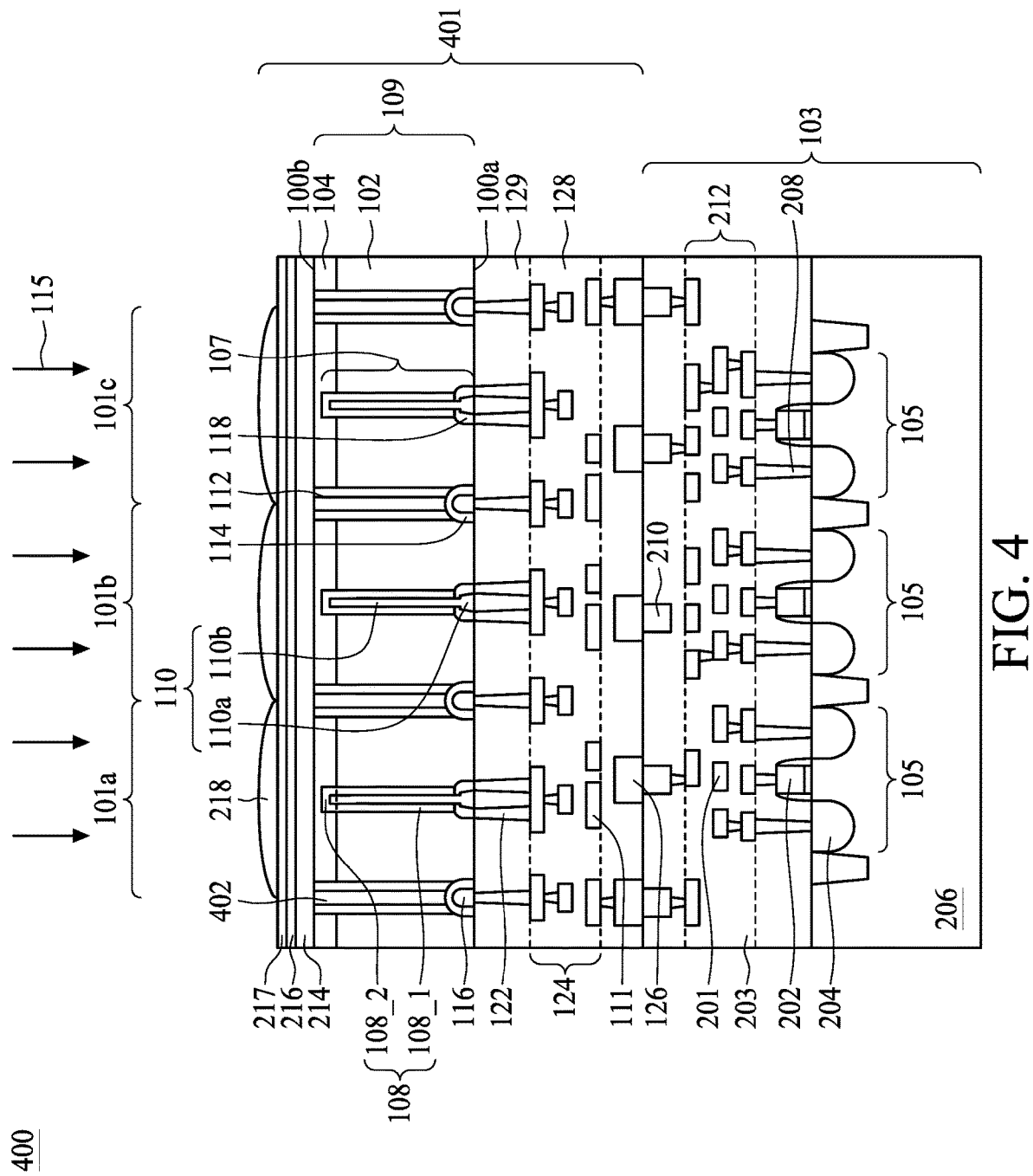
FIG. 4 is a diagram illustrating a cross-sectional view of a SPAD image sensor including a CMOS chip and an imaging chip bonded together in accordance with a third embodiment of the present disclosure.

FIG. 4 is a diagram illustrating a cross-sectional view of a SPAD image sensor 400 including the CMOS chip 103 and an imaging chip 401 bonded together in accordance with a third embodiment of the present disclosure. The imaging chip 401 is the same to the imaging chip 101 except the imaging chip 401 further includes a backside deep trench isolation (BDTI) 402 in the implant region 112 in order to suppress cross-talk between adjacent SPAD cells 107. The BDTI 402 is formed of a dielectric material such as an oxide (silicon oxide, for example), a nitride (silicon nitride or silicon oxynitride, for example), a low-k dielectric, and/or another suitable dielectric material. The BDTI 402 extends from the back surface 100b of the substrate 109 to the shallow well region 114, and sidewalls of the BDTI 402 is surrounded by the implant region 112.

Figure 5:
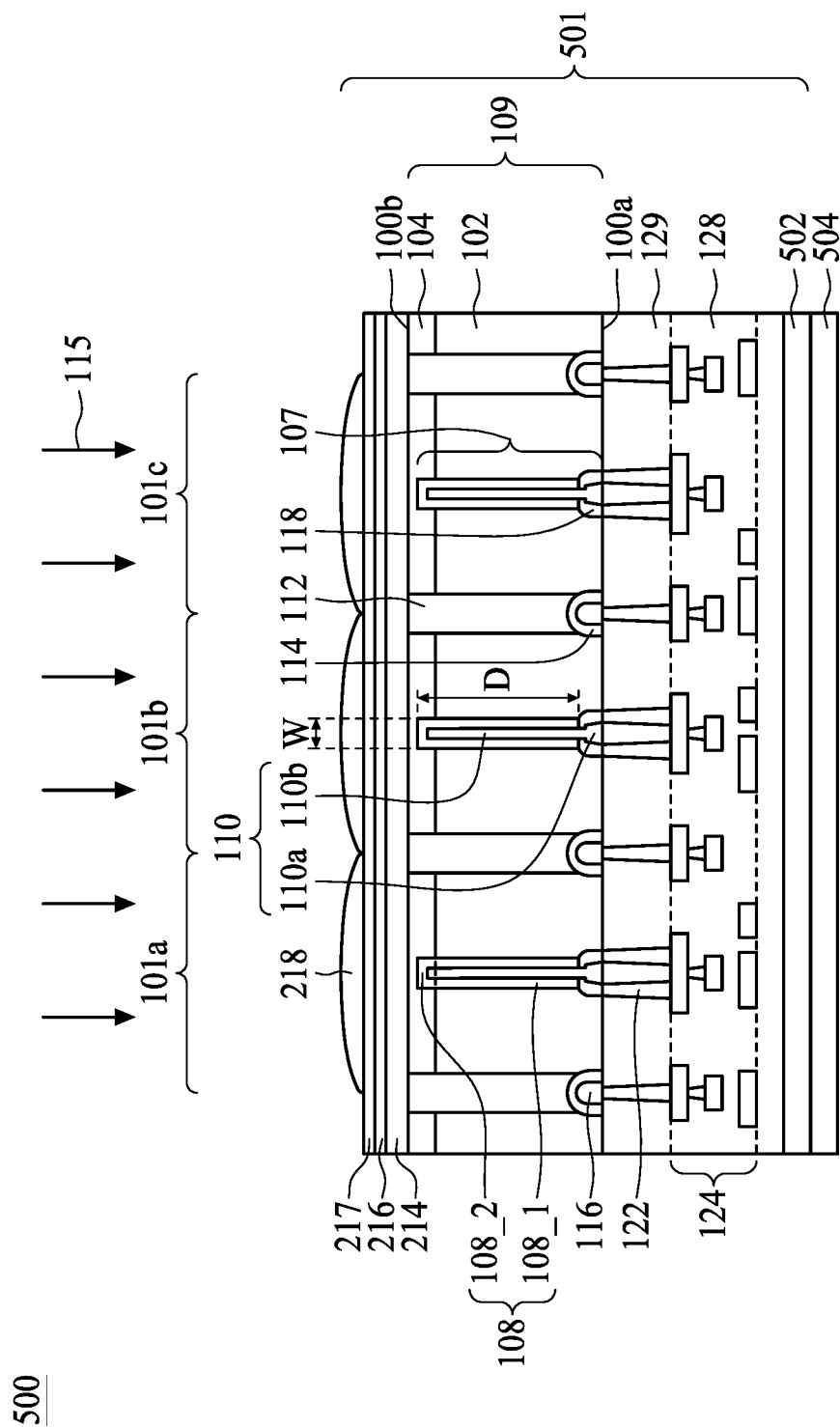
FIG. 5 is a diagram illustrating a cross-sectional view of a SPAD image sensor including a CMOS chip in accordance with a fourth embodiment of the present disclosure.

FIG. 5 is a diagram illustrating a cross-sectional view of a SPAD image sensor 500 including an imaging chip 501 in accordance with a fourth embodiment of the present disclosure. The imaging chip 501 is the same to the imaging chip 101 except the imaging chip 501 is bonded to a carrier substrate 504 through a buffer layer 502. The buffer layer 502 may include a dielectric material such as silicon oxide. Alternatively, the buffer layer 502 may optionally include silicon nitride. The carrier substrate 504 may include a silicon material. Alternatively, the carrier substrate 504 may include a glass substrate or other suitable materials. The carrier substrate 504 may be bonded to the buffer layer 502 by molecular forces, i.e., a technique known as direct bonding or optical fusion bonding, or by other bonding techniques known in the art, such as metal diffusion or anodic bonding. The buffer layer 502 provides electrical isolation and protection for the various features formed on the front surface 100a of the substrate 109. The carrier substrate 504 also provides mechanical strength and support for processing the SPAD image sensor 500.

In some embodiments, a plurality of active devices (not shown) may be integrated in the imaging chip 501. The active devices may be formed in the substrate 109 around the array of pixels 101a to 101c. For instance, the active devices may include the active quench circuit, the read circuit and other control or logic circuits.

Figure 6:
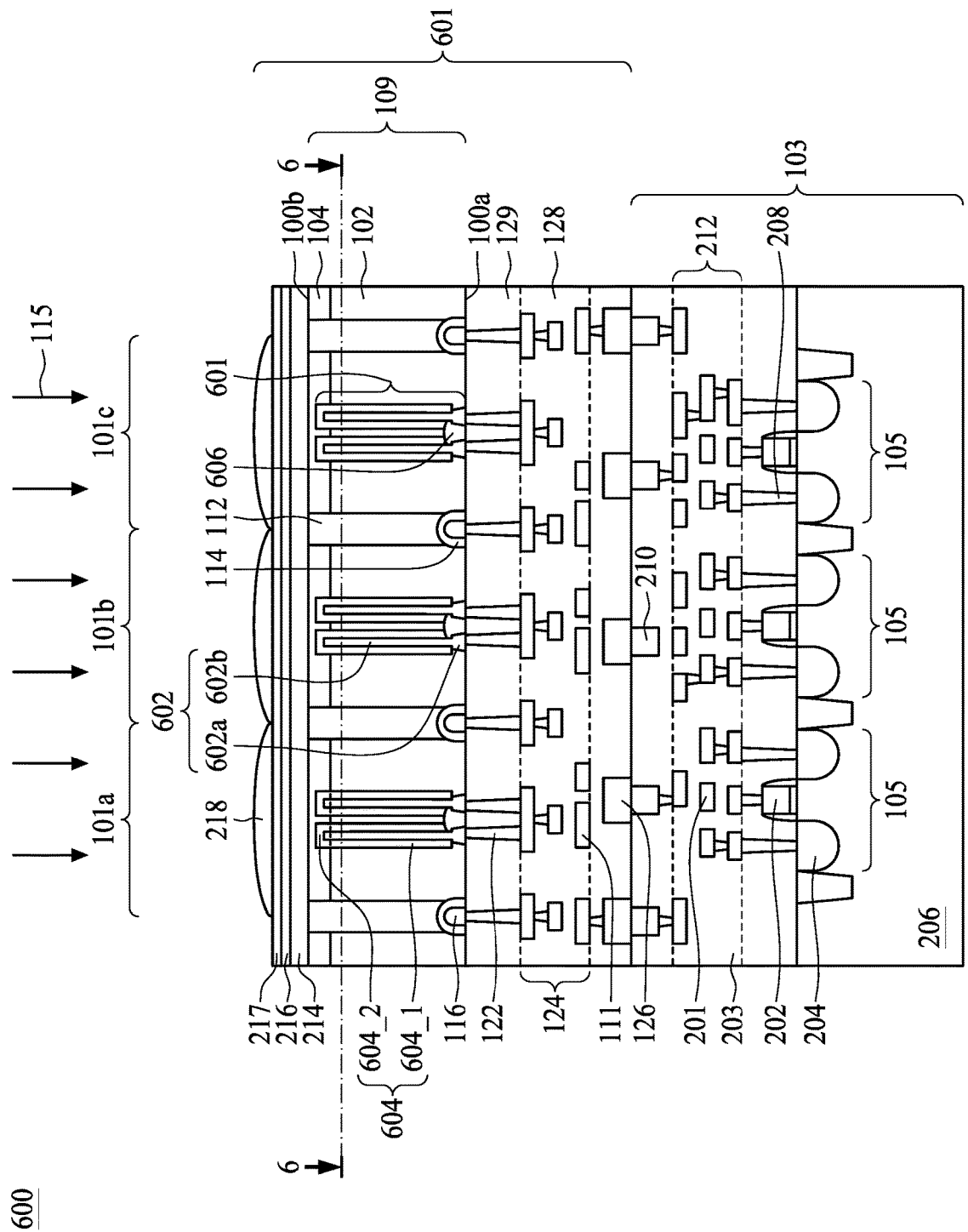
FIG. 6 is a diagram illustrating a cross-sectional view of a SPAD image sensor including a CMOS chip and an imaging chip bonded together in accordance with a fifth embodiment of the present disclosure.
Figure 7:
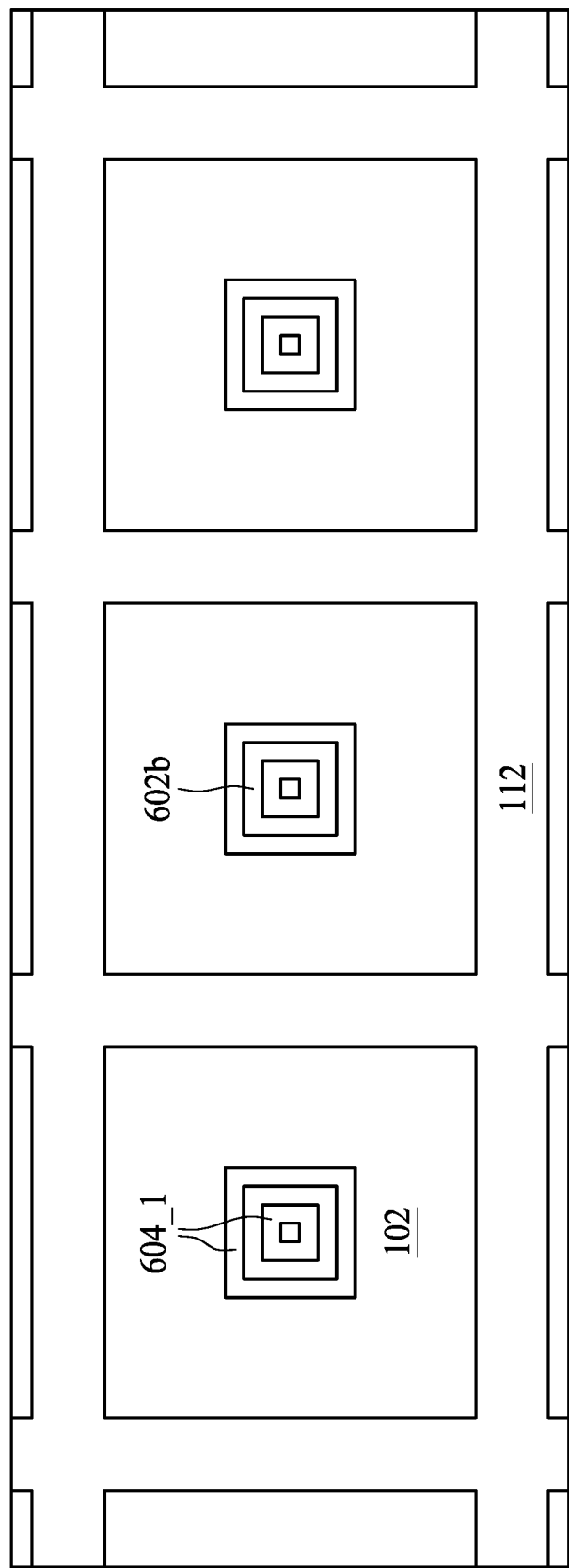
FIG. 7 is diagram illustrating a cross-sectional view of the SPAD image sensor taken along the lines 6-6 of FIG. 6.

FIG. 6 is a diagram illustrating a cross-sectional view of a SPAD image sensor 600 including an imaging chip 601 in accordance with a fifth embodiment of the present disclosure. The imaging chip 601 is the same to the imaging chip 101 except SPAD cells 607 of the imaging chip 601 have a structure different from the SPAD cells 107. Please refer to FIG. 7 in conjunction with FIG. 6. FIG. 7 is diagram illustrating a cross-sectional view of the SPAD image sensor 600 taken along the lines 6-6 of FIG. 6. The SPAD cells 607 respectively include a DTI 602, an epitaxial layer 604 and a heavily doped region 606. Unlike the DTI 110, which is a solid pillar with its outer sidewalls surrounded by the epitaxial layer 108, the DTI 602 is structured as a square ring from a top view with its inner and outer sidewalls and a bottom surrounded by the epitaxial layer 604 as shown in FIG. 7. The structure of the SPAD cells 607 is able to further suppress the high concentration junction band to band tunneling leakage. The DTI 602 includes a first potion 602a abutting the front surface 100a of the substrate 109 and a second portion 602b abutting the first potion 602a. In many instances, the first portion 602a of the DTI 602 has a width wider than the second portion 602b. In other words, inner and outer sidewalls of the first portion 602a may be laterally protruding from inner and outer sidewalls of the second portion 602b respectively. The first portion 602a may be fully disposed in the first layer 102 of the substrate 109. The second portion 602b may be disposed across the interface between the first layer 102 and the second layer 104.

The sidewalls and a bottom of the second portion 602b of the DTI 602 are surrounded by the epitaxial layer 604. The epitaxial layer 604 is doped with dopants of the second conductivity type opposite to the first conductivity type. The epitaxial layer 604 includes a main portion 604_1 and a bottom portion 604_2. The main portion 604_1 is substantially located in the first layer 102 and has a uniform dopant concentration at a level of about 1e18/cm$^3$. The main portion 604_1 of the epitaxial layer 604 is configured as a sensing node to detect electrons generated in the first layer 102. A function of the bottom portion 604_2 of the epitaxial layer 604 may be more like for electric field relaxing. In many instances, a dopant concentration in a bottom portion 604_2 of the epitaxial layer 604 in the second layer 104 may gradually decrease from the main portion 604_1 toward the back surface 100b. For example, the bottom portion 604_2 of the epitaxial layer 604 may have a dopant concentration ranging from about 1e16/cm$^3$ to about 1e18/cm$^3$.

A heavily doped region 606 is substantially formed between inner sidewalls of the first portion 602a. Alternatively stated, the heavily doped region 606 fills the space fenced by the first portion 602a of the DTI 602. In that way, the heavily doped region 606 is prevented from being laterally contact with the first layer 102, and the first portion 602a functions as a guard ring. In some embodiments, the heavily doped region 606 may extend toward the region between inner sidewalls of the second portion 602b. The heavily doped region 606 is doped with dopants of the second conductivity type opposite to the first conductivity type, and a dopant concentration of the heavily doped region 606 is higher than the dopant concentration of the epitaxial layer 604. The heavily doped region 606 functions as an electrode of the SPAD cells 607.

Figure 8:
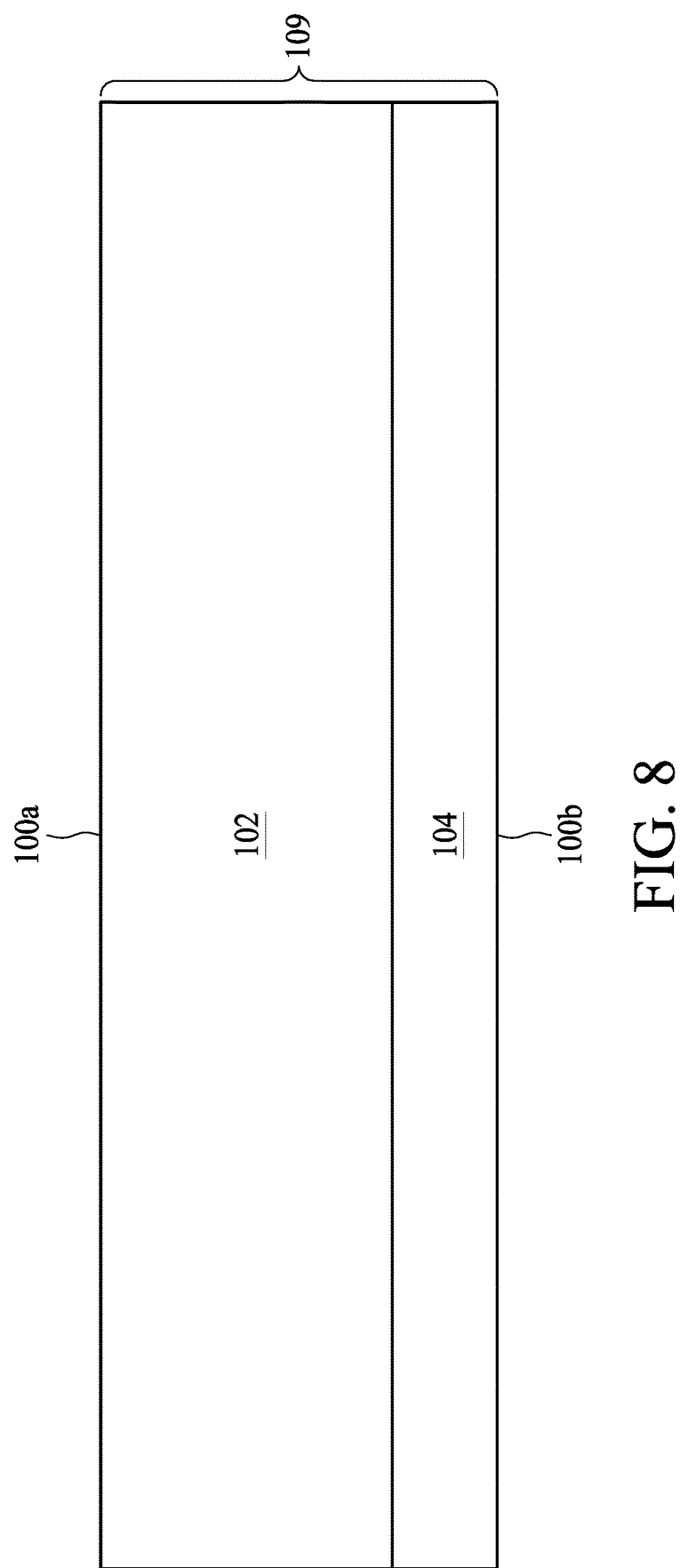
FIG. 8 to FIG. 15 are diagrams illustrating fragmentary cross-sectional views of a SPAD image sensor of FIG. 1 at various stages of fabrication in accordance with a preferred embodiment of the disclosure.

FIG. 8 to FIG. 15 are diagrams illustrating fragmentary cross-sectional views of the SPAD image sensor 100 at various stages of fabrication in accordance with a preferred embodiment of the disclosure. It is understood that FIG. 8 to FIG. 15 have been simplified for a better understanding of the inventive concepts of the present disclosure and may not be drawn to scale. With reference to FIG. 8, the substrate 109 is provided. The substrate 109 includes the first layer 102 and the second layer 104 on the first layer 102. The first layer 102 may be doped with dopants of the first conductivity type, and has a dopant concentration at a level of about 1e17/cm$^3$. The second layer 104 may be doped with dopants of the first conductivity type, and has a dopant concentration at a level of about 1e15/cm$^3$, which is lighter than the first layer 102. In some embodiments, the first layer 102 and the second layer 104 are p-type epitaxial layers doped with a p-type dopant such as Boron. The substrate 109 has the front surface 100a and the back surface 100b. For a SPAD image sensor of the present embodiment, radiation is projected from the back surface 100b and enters the first layer 102 through the second layer 104.

Figure 9:
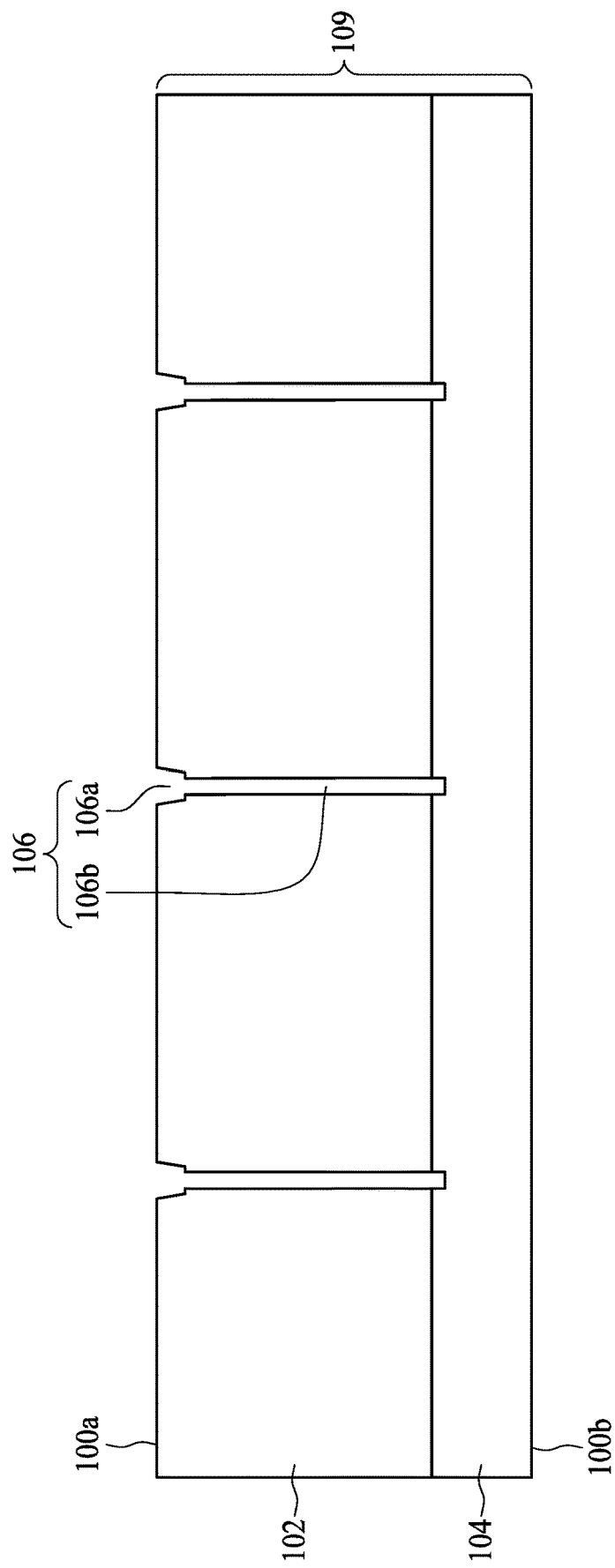

With reference to FIG. 9, an etching process may be performed to obtain recess structures 106 at the front surface 100a. The recess structures 106 respectively include a first portion 106a abutting the front surface 100a of the substrate 109 and a second portion 106b abutting the first potion 106a. In many instances, the first portion 106a of the recess structures 106 has a width wider than the second portion 106b. In other words, sidewalls of the first portion 106a may be laterally protruding from sidewalls of the second portion 106b. The first portion 106a may be fully disposed in the first layer 102 of the substrate 109. The second portion 106b may be disposed in the first layer 102 and further down to the second layer 104, thereby isolating SPAD cells of each individual pixel. In this embodiment, the etching process includes a dry etching process. An etching mask (for example a hard mask, not illustrated herein) may be formed before the etching process is performed to define the size and location of the recess structures 106. Three of such recess structures 106 are illustrated in FIG. 9 for the sake of providing an illustration. The first portion 106a and second portion 106b of the recess structures 106 may be formed to respectively have a rectangular shape, somewhat a trapezoidal shape, or another suitable shape.

Figure 10:
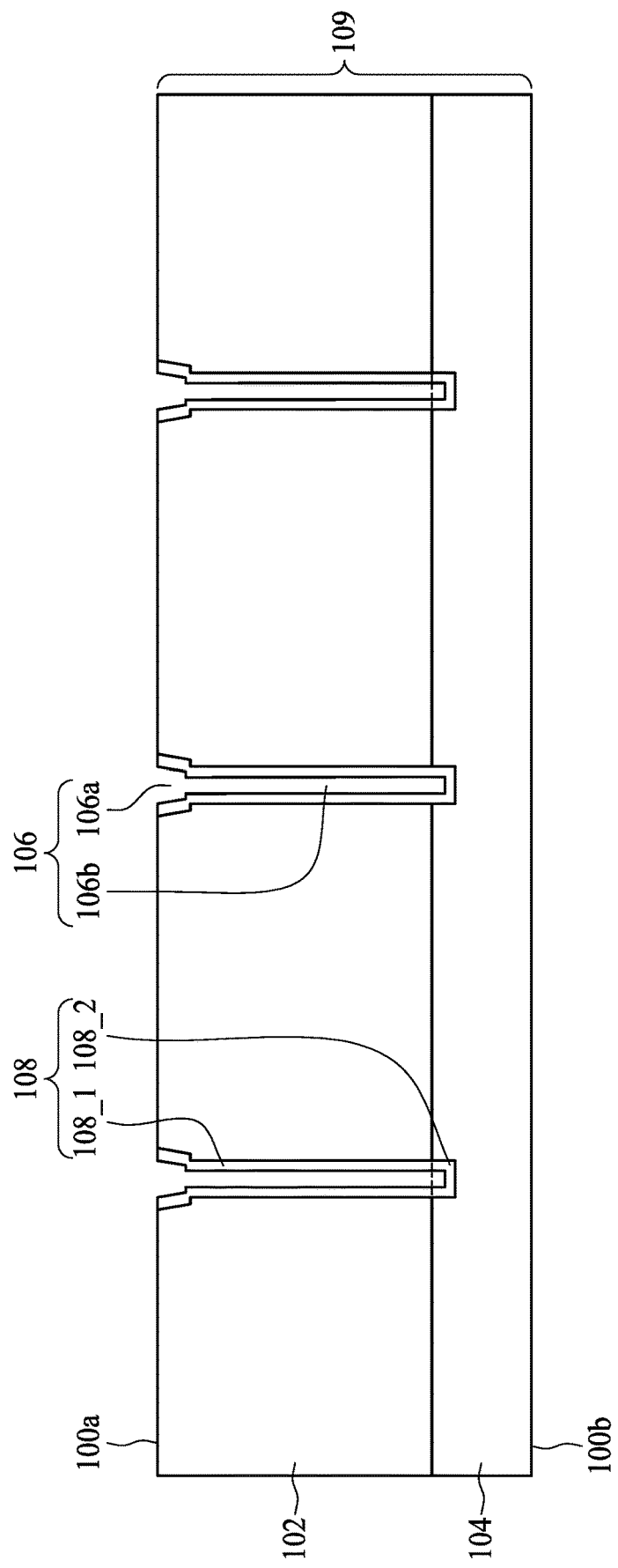

Referring now to FIG. 10, an epitaxy growth on the exposed surfaces including the sidewalls and bottoms of the recess structures 106 may be implemented by utilizing suitable gas under a proper pressure to introduce dopants. The epitaxial layer 108 may be formed in a conformal manner around the recess structures 106 according to one embodiment of the present disclosure. The epitaxial layer 108 is doped with dopants of the second conductivity type opposite to the first conductivity type. In some embodiments, the epitaxial layer 108 is an n-type epitaxial layer doped with an n-type dopant. Boundaries or interfaces between the epitaxial layer 108 and the substrate 109 are p-n junctions. The conformal shape of the epitaxial layer 108 may mean that the profile of the epitaxial layer 108 follows or takes on the profile of its corresponding recess structures 106. The dopants may be introduced into the epitaxial layer 108 by selective in-situ epitaxy growth, solid phase doping method or the gas phase doping method.

The epitaxial layer 108 includes a main portion 108_1 and a bottom portion 108_2. The main portion 108_1 is substantially located in the first layer 102 and has a uniform dopant concentration at a level of about 1e18/cm$^3$. A dopant concentration in a bottom portion 108_2 of the epitaxial layer 108 in the second layer 104 may gradually decrease from the main portion 108_1 toward the back surface 100b. For example, the bottom portion 108_2 of the epitaxial layer 108 may have a dopant concentration ranging from about 1e16/cm$^3$ to about 1e18/cm$^3$.

Figure 11:
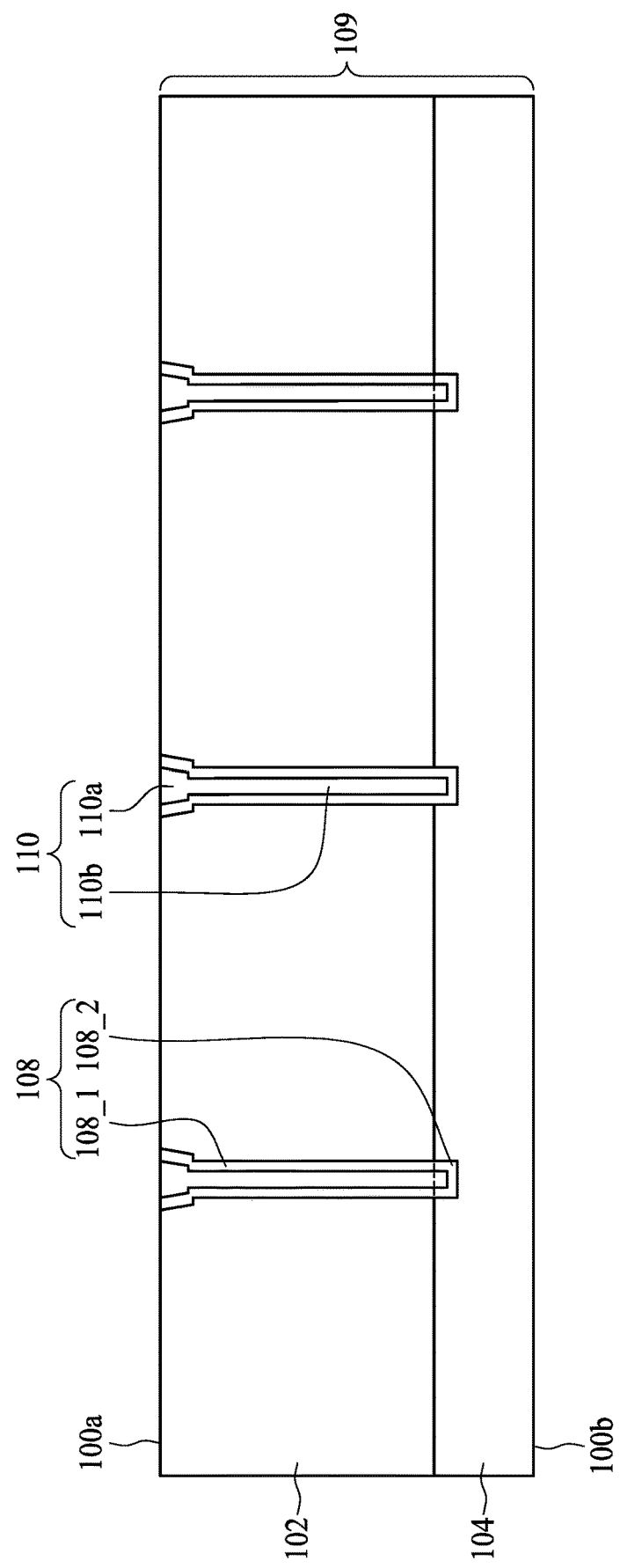

Referring now to FIG. 11, after the epitaxial layer 108 is formed, a dielectric material is deposited to fill the recess structures 106, resulting in the DTI 110. The dielectric material mentioned above includes an oxide (silicon oxide, for example), a nitride (silicon nitride or silicon oxynitride, for example), a low-k dielectric, and/or another suitable dielectric material. The DTI 110 includes the first potion 110a abutting the front surface 100a of the substrate 109 and the second portion 110b abutting the first potion 110a. In many instances, the first portion 110a of the DTI 110 has a width wider than the second portion 110b. In other words, sidewalls of the first portion 110a may be laterally protruding from sidewalls of the second portion 110b. The first portion 110a may be fully disposed in the first layer 102 of the substrate 109. The second portion 110b may be disposed across the interface between the first layer 102 and the second layer 104.

Figure 12:
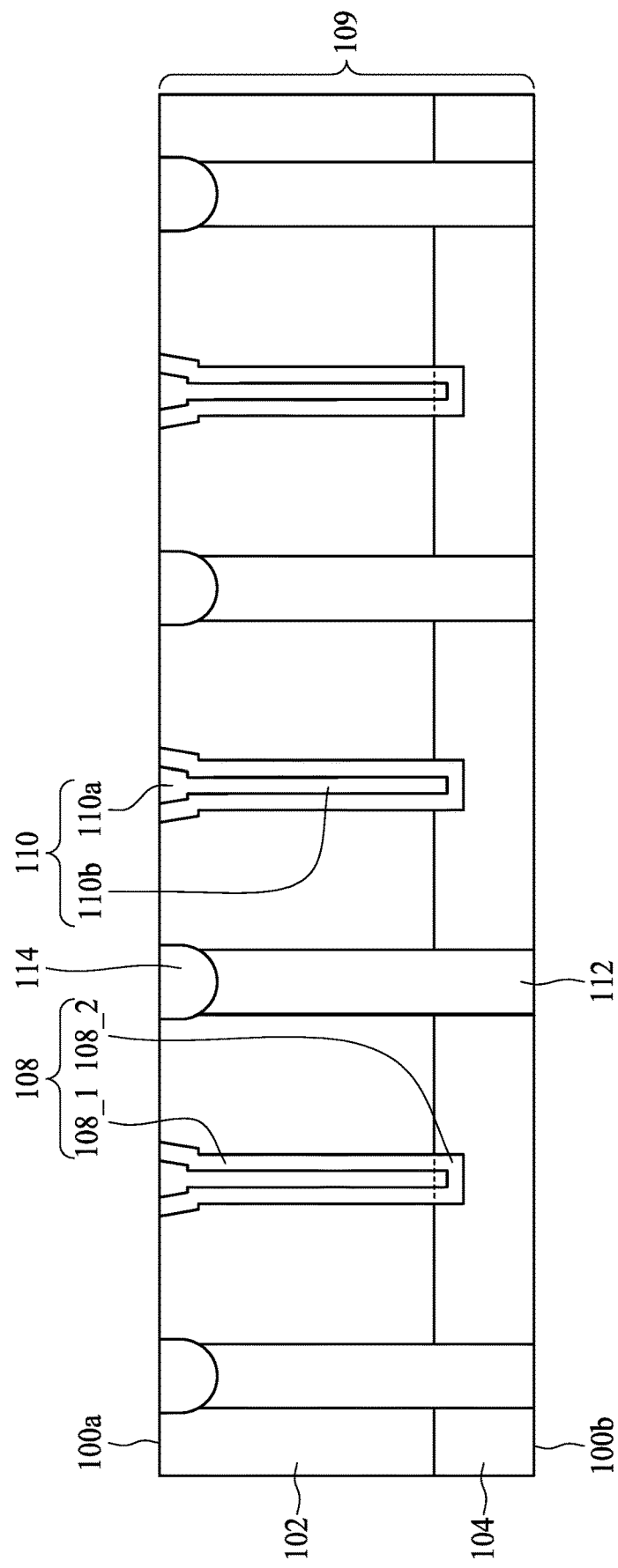
Figure 13:
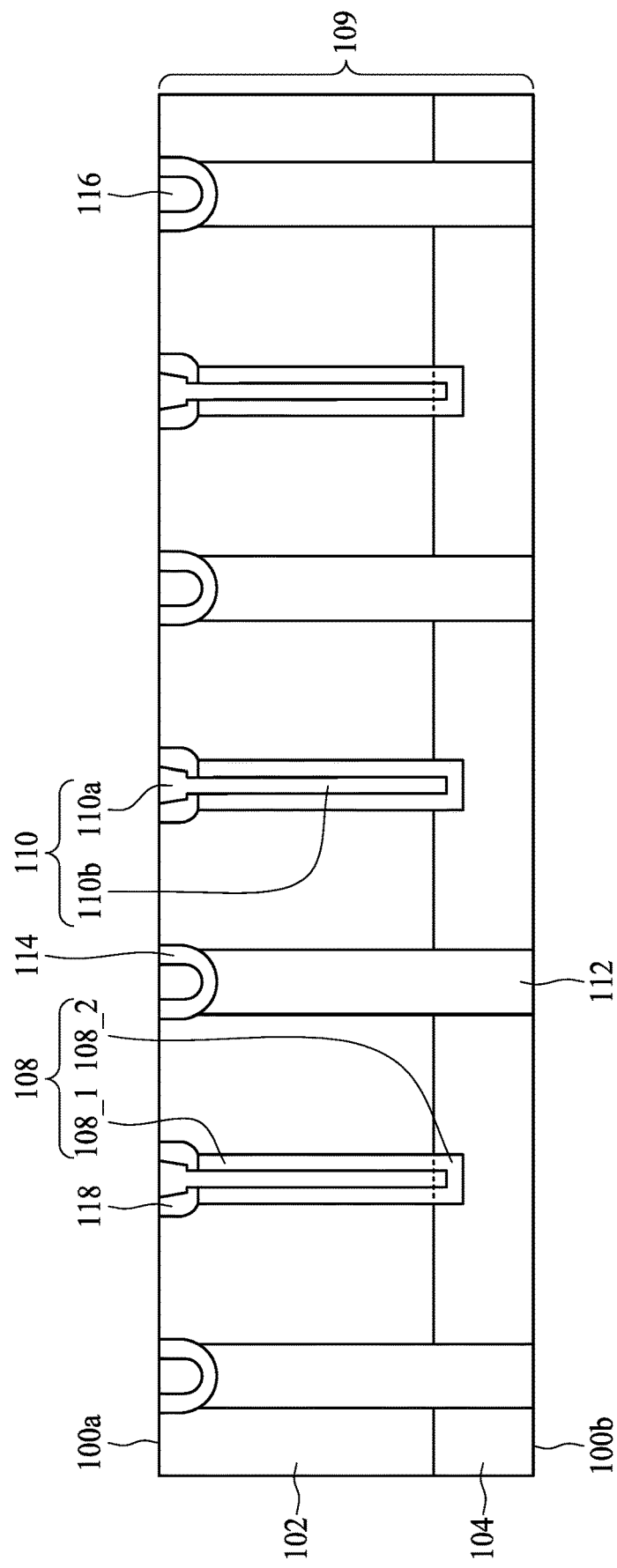

Referring to FIG. 12, the implant regions 112 are formed by ion implantation with dopants of the first conductivity type, for instance, the p-type dopant. The implant regions 112 may have a dopant concentration the same to or greater than the first layer 102. Then the shallow well region 114 of the first conductivity type, for instance, the p-type, may be optionally disposed between the implant region 112 and the front surface 100a of the substrate 109. A rapid thermal anneal (RTA) process may be performed to drive dopant of the epitaxial layer 108 to diffuse into neighboring regions thereof. In this way, a graded transition from the p-type doping to the n-type doping is therefore formed between the substrate 109 and the epitaxial layer 108. With reference to FIG. 13, the heavily doped regions 116 and 118 may be formed on a top surface of the shallow well region 114 and the epitaxial layer 108 respectively for low resistance contact.

Figure 14:
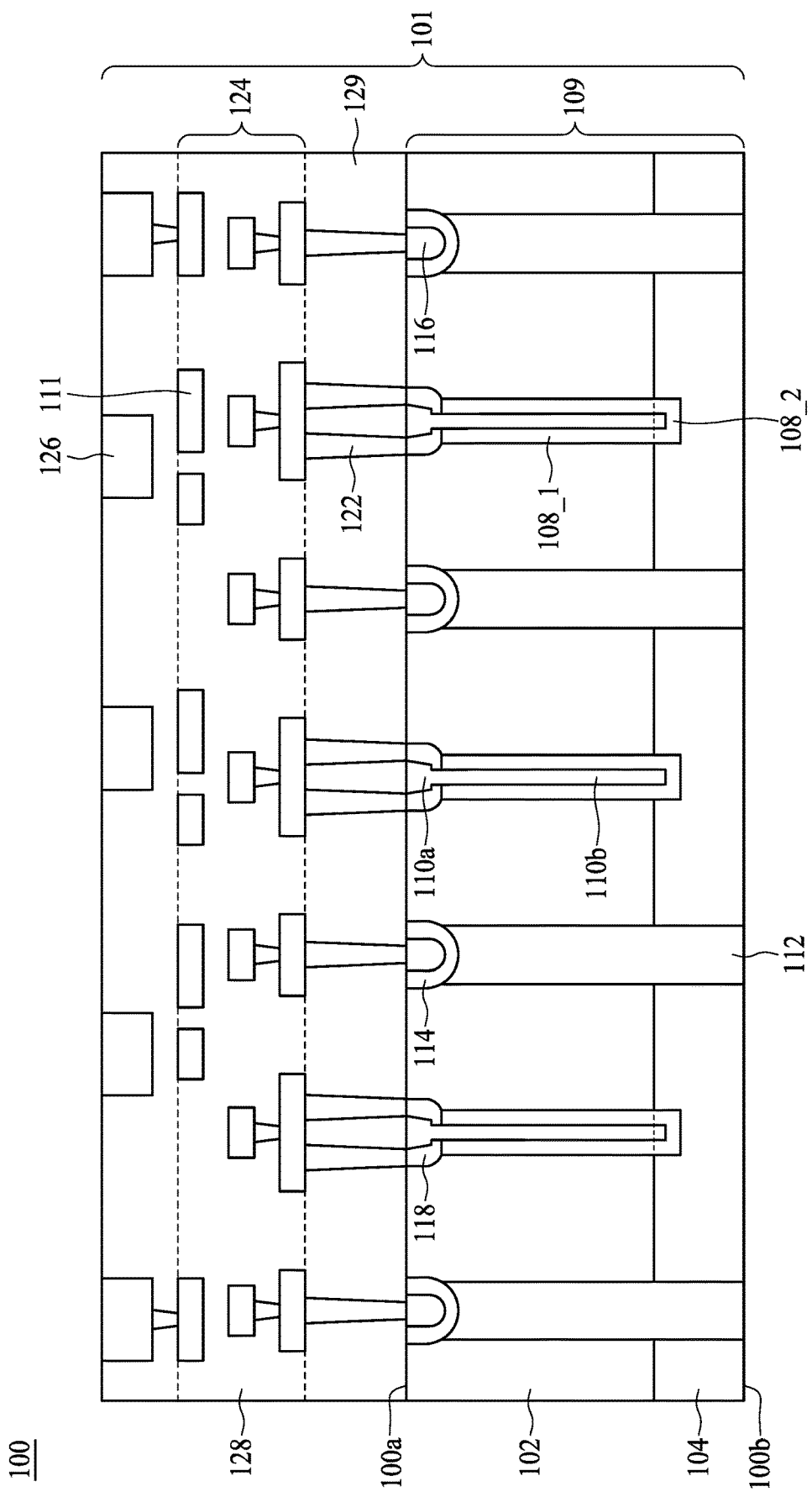

As shown in FIG. 14, contact plugs 122 are formed for the heavily doped regions 116 and 118. In some embodiments, the contact plugs 122 may be formed by forming a dielectric layer 129 over the front surface 100a of the substrate 109. The dielectric layer 129 is subsequently etched to form via holes and/or metal trenches. The via holes and/or metal trenches are then filled with a conductive material to form the contact plugs 122. In some embodiments, the contact plugs 122 may be comprised of tungsten, copper, or aluminum copper, for example. The interconnect structure 124 is formed over the substrate 109, forming the imaging chip 101. In some embodiments, the interconnect structure 124 may be formed by forming the ILD layer 128, which includes one or more layers of ILD material, over the dielectric layer 129. The ILD layer 128 is subsequently etched to form via holes and/or metal trenches. The via holes and/or metal trenches are then filled with a conductive material to form the plurality of metal layers 111. In some embodiments, the ILD layer 128 may be deposited by a physical vapor deposition technique (e.g., PVD, CVD, etc.). The plurality of metal layers 111 may be formed using a deposition process and/or a plating process (e.g., electro-plating, electro-less plating, etc.). In various embodiments, the plurality of metal layers 111 may be comprised of tungsten, copper, or aluminum copper, for example. In some embodiments, a top metal layer 126 of the plurality of metal layers 111 has an upper surface aligned with an upper surface of the ILD layer 128.

Figure 15:
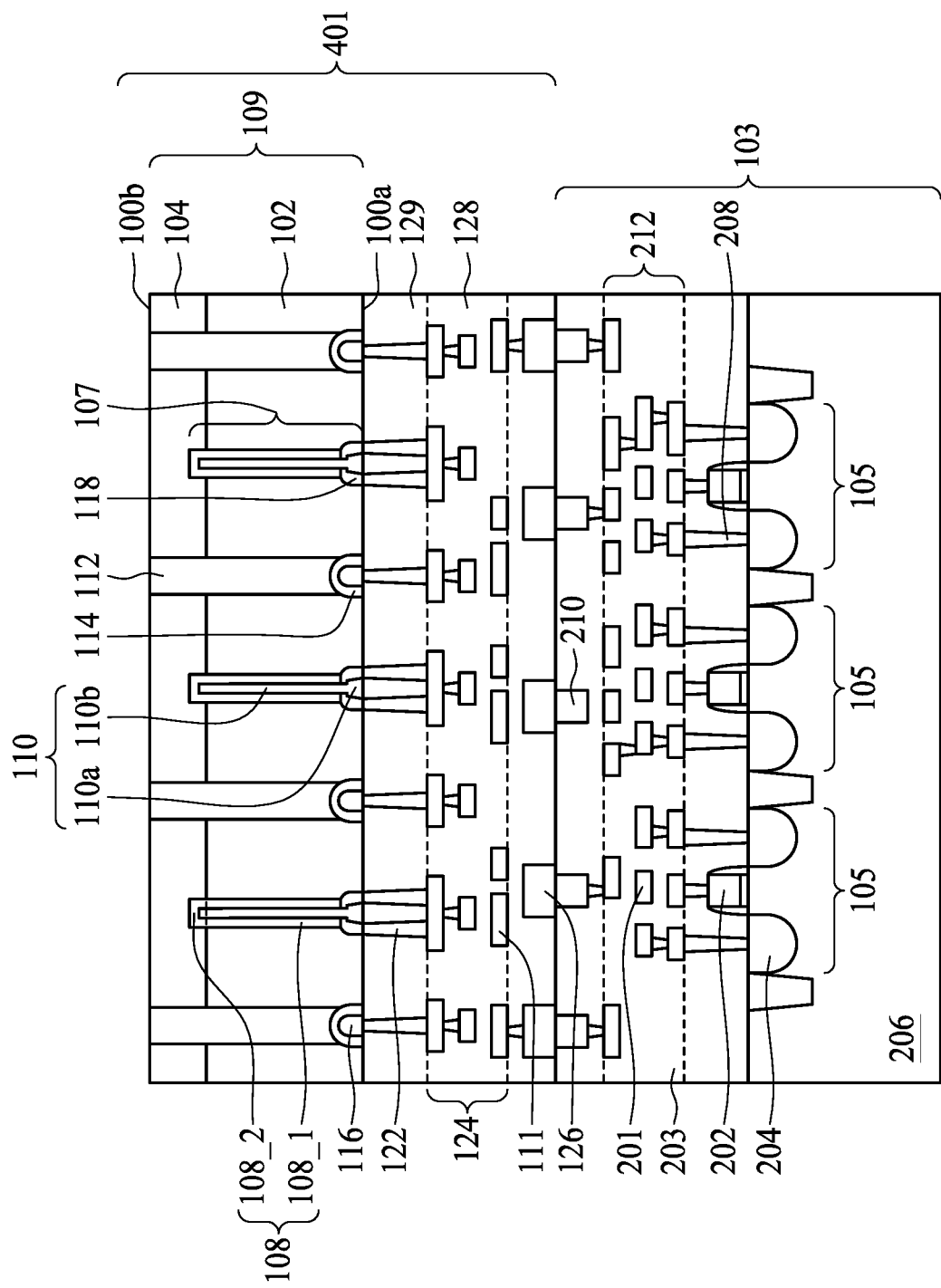

As shown in FIG. 15, the imaging chip 101 is bonded to the CMOS chip 103. The CMOS chip 103 includes the substrate 206. The active devices 105 are formed within the substrate 206. In various embodiments, the substrate 206 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the active devices 105 may include transistors formed by depositing the gate structure 202 over the substrate 206 and forming the source/drain regions 204 by implantation or epitaxial growth. The interconnect structure 212 is formed over the substrate 206, to form the CMOS chip 103. In some embodiments, the interconnect structure 212 may be formed by forming the ILD layer 203, which includes one or more layers of ILD material, over the substrate 206. The ILD layer 203 is subsequently etched to form via holes and/or metal trenches. The via holes and/or metal trenches are then filled with a conductive material to form the plurality of metal layers 201. In some embodiments, the ILD layer 203 may be deposited by a physical vapor deposition technique (e.g., PVD, CVD, etc.). The metal layers 201 may be formed using a deposition process and/or a plating process (e.g., electro-plating, electro-less plating, etc.). In various embodiments, the plurality of metal layers 201 may be comprised of tungsten, copper, or aluminum copper, for example. In some embodiments, the top metal layer 210 of the plurality of metal layers 201 has an upper surface aligned with an upper surface of the ILD layer 203.

In some embodiments, the bonding process may form a hybrid bond including a metal-to-metal bond and a dielectric-to-dielectric bond. The top metal layer 210 and the top metal layer 126 can be bonded together in direct. The ILD layer 128 and the ILD layer 203 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the ILD layer 128 and the ILD layer 203.

Referring back to FIG. 1, a thickness of the bonded imaging chip 101 may be reduced. Thinning the substrate 109 allows incident radiations pass through a back surface 100b of the substrate 109 to arrive the SPAD cells 107. In some embodiments, the substrate 109 may be thinned by etching the back surface 100b of the substrate 109. In other embodiments, the substrate 109 may be thinned by mechanical grinding the back surface 100b of the substrate 109. In some embodiments, the substrate 109 may be thinned but not expose the epitaxial layer 108. The high-k dielectric layer 214 is formed over the back surface 100b of the substrate 109. An ARC layer 216 can be formed over the high-k dielectric layer 214. In some embodiments, the high-k dielectric layer 214 and the ARC layer 216 may be deposited using a physical vapor deposition technique.

The color filters 217 can be formed over the back surface 100b of the substrate 109. In some embodiments, the color filters 217 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. The micro-lenses 218 can also be formed over the color filters 217. In some embodiments, the micro-lenses 218 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The micro-lenses 218 are then formed by selectively etching the micro-lens material according to the micro-lens template.

Figure 16:
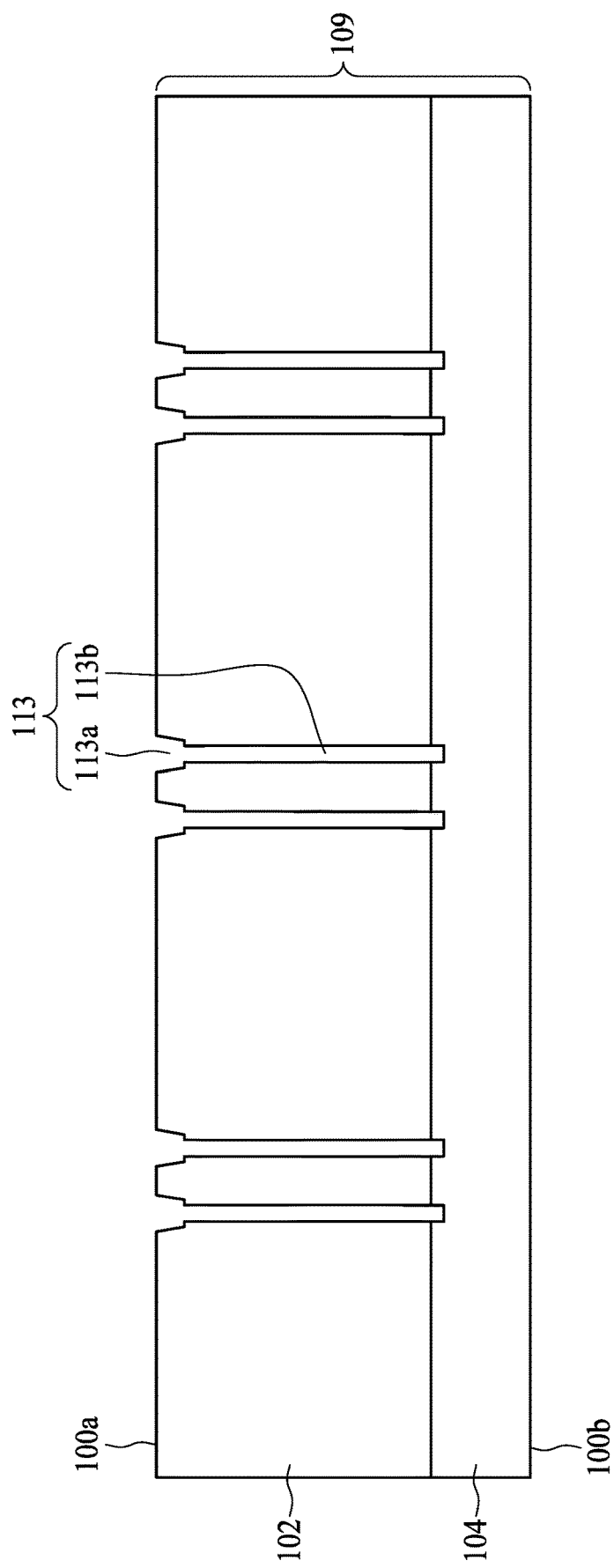
FIG. 16 to FIG. 20 are diagrams illustrating fragmentary cross-sectional views of a SPAD image sensor of FIG. 6 at various stages of fabrication in accordance with a preferred embodiment of the disclosure.

FIG. 16 to FIG. 20 are diagrams illustrating fragmentary cross-sectional views of the SPAD image sensor 600 at various stages of fabrication in accordance with a preferred embodiment of the disclosure. It is understood that FIG. 16 to FIG. 20 have been simplified for a better understanding of the inventive concepts of the present disclosure and may not be drawn to scale. With reference to FIG. 16, the substrate 109 similar to FIG. 8 is provided. An etching process may be performed to obtain recess structures 113 at the front surface 100a. The recess structures 113 is structured as square rings from a top view, and respectively include a first portion 113a abutting the front surface 100a of the substrate 109 and a second portion 113b abutting the first potion 113a. In many instances, the first portion 113a of the recess structures 113 has a width wider than the second portion 113b. In other words, sidewalls of the first portion 113a may be laterally protruding from sidewalls of the second portion 113b. The first portion 113a may be fully disposed in the first layer 102 of the substrate 109. The second portion 113b may be disposed in the first layer 102 and further down to the second layer 104, thereby isolating SPAD cells of each individual pixel. The etching process may be similar to that of FIG. 9.

Figure 17:
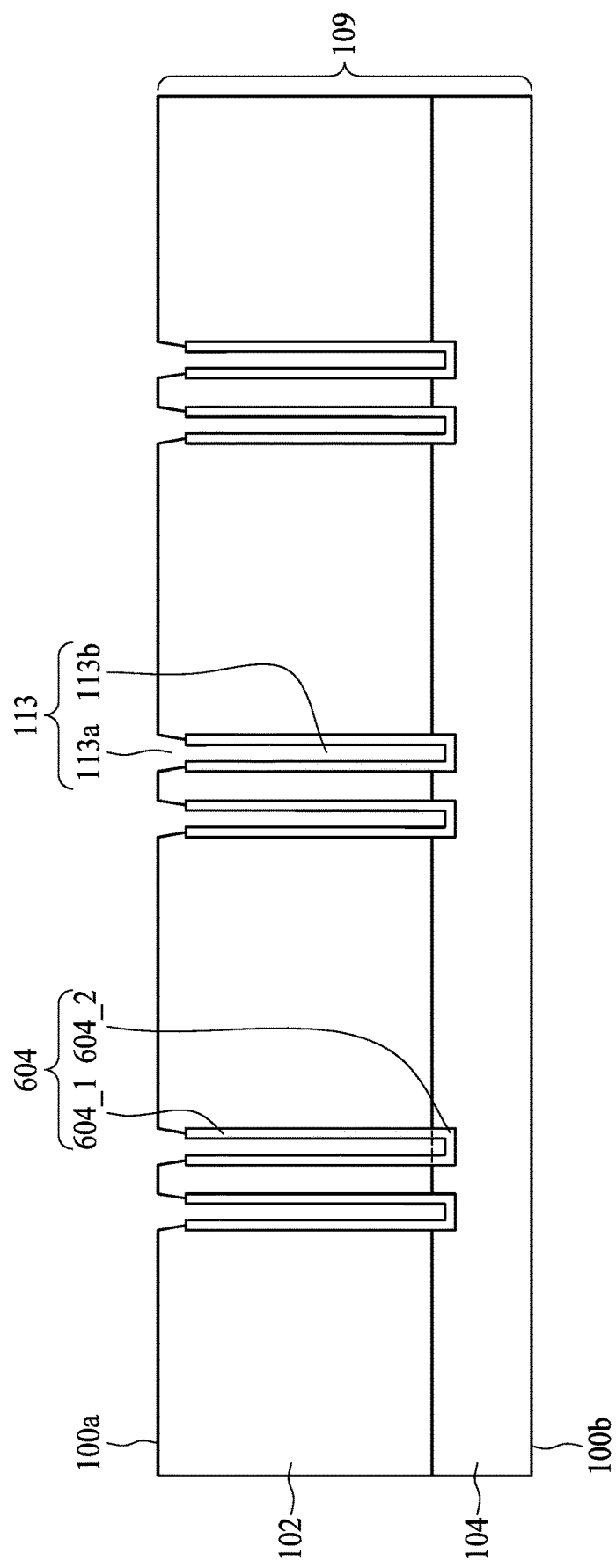

Referring now to FIG. 17, an epitaxy growth on the exposed surfaces including the sidewalls and bottoms of the second portion 113b of the recess structures 113 may be implemented by utilizing suitable gas under a proper pressure to introduce dopants. Sidewalls of the first portion 113a of the recess structures 113 are not covered by the epitaxy growth. The epitaxial layer 604 may be formed in a conformal manner around the second portion 113b of the recess structures 113 according to one embodiment of the present disclosure. The epitaxial layer 604 includes a main portion 604_1 and a bottom portion 604_2. Other details of epitaxial layer 604 are similar to that of FIG. 10.

Figure 18:
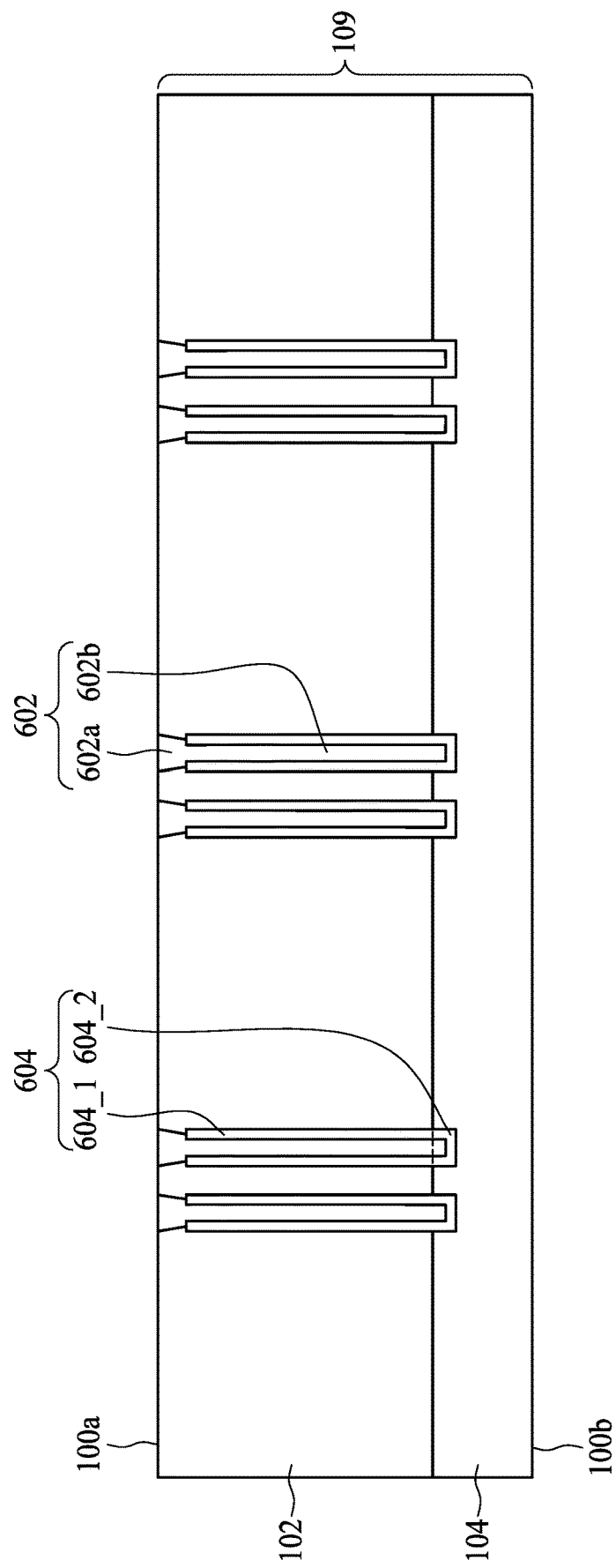
Figure 19:
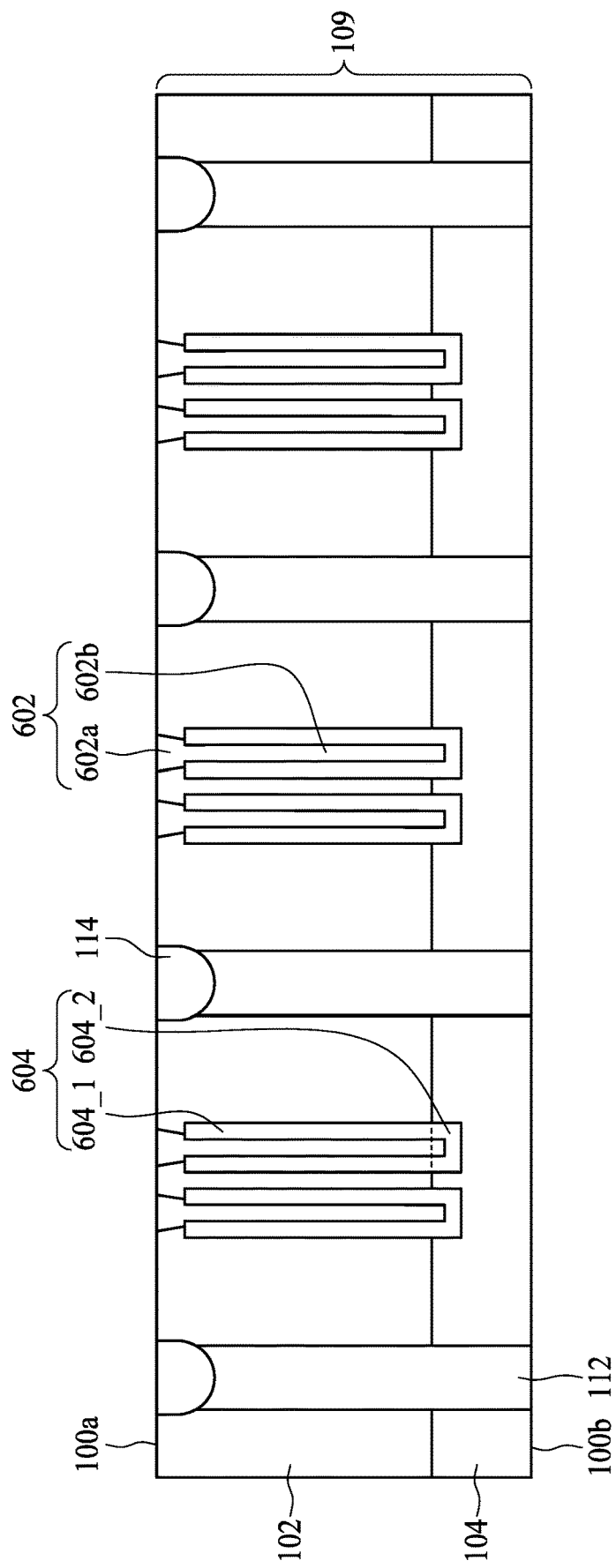
Figure 20:
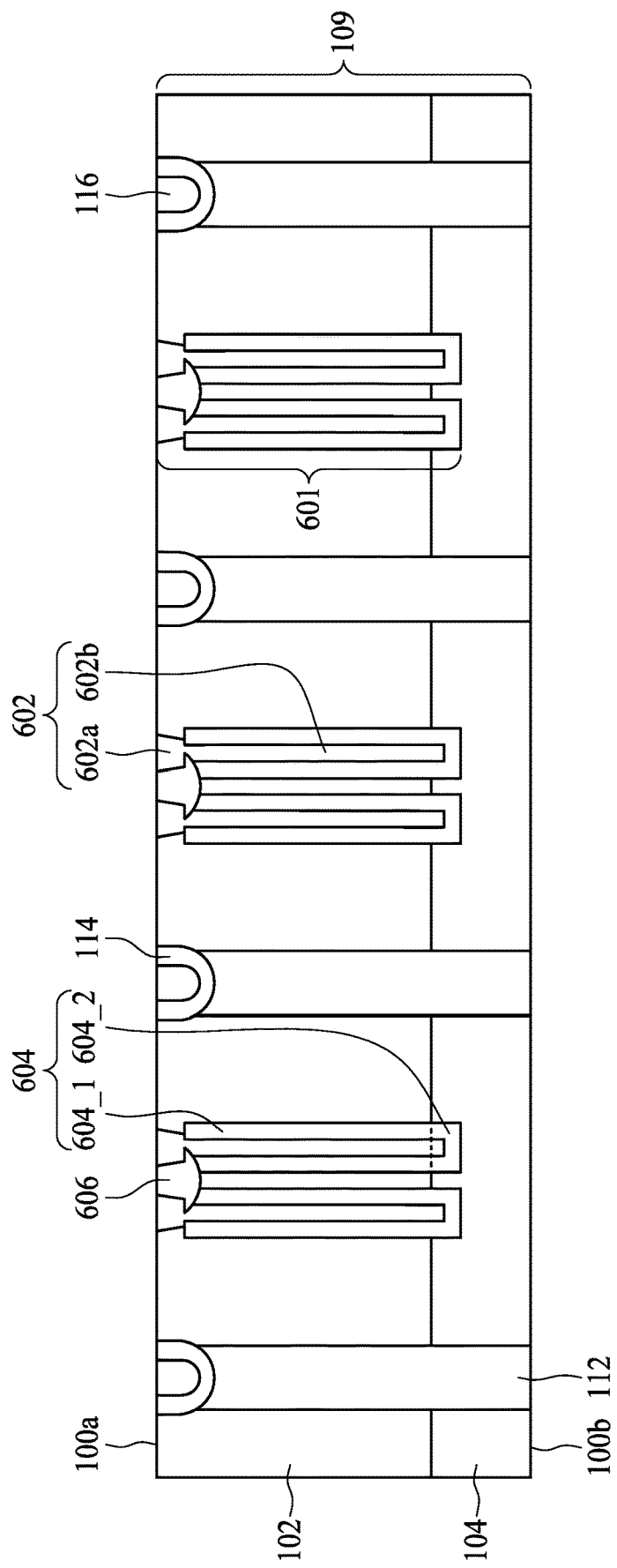

Referring now to FIG. 18, a dielectric material is deposited to fill the recess structures 113, resulting in the DTI 602. The DTI 602 includes the first potion 602a abutting the front surface 100a of the substrate 109 and the second portion 602b abutting the first potion 602a. Other details of epitaxial layer 604 are similar to that of FIG. 11. The operation of FIG. 19 is similar to that of FIG. 12. As for FIG. 20, the heavily doped regions 116 and 606 may be formed on a top surface of the shallow well region 114 and the front surface 100a of the first layer 102 respectively for low resistance contact. In particular, the heavily doped region 606 is substantially formed between inner sidewalls of the first portion 602a of the DTI 602. The remaining process to form the SPAD image sensor 600 is similar to that of the SPAD image sensor 100 and therefore is omitted here for simplicity.

Some embodiments of the present disclosure provide a single photon avalanche diode (SPAD) image sensor. The SPAD image sensor includes: a substrate of a first conductivity type, the substrate having a front surface and a back surface; a deep trench isolation (DTI) extending from the front surface toward the back surface of the substrate, the DTI having a first surface and a second surface opposite to the first surface, the first surface being level with the front surface of the substrate; an epitaxial layer of a second conductivity type opposite to the first conductivity type, the epitaxial layer surrounding sidewalls and the second surface of the DTI; and an implant region of the first conductivity type extending from the front surface to the back surface of the substrate.

Some embodiments of the present disclosure provide a single photon avalanche diode (SPAD) image sensor. The SPAD image sensor includes: a first epitaxial layer of a first conductivity type, the first epitaxial layer having a front surface and a back surface; a second epitaxial layer of the first conductivity type, the second epitaxial layer having a front surface and a back surface, the second epitaxial layer being formed over the first epitaxial layer with the front surface of the second epitaxial layer facing the back surface of the first epitaxial layer, a dopant concentration of the first conductivity type of the first epitaxial layer is higher than a dopant concentration of the first conductivity type of the second epitaxial layer; a deep trench isolation (DTI) extending from the front surface of the first epitaxial layer toward the back surface of the second epitaxial layer, the DTI having a first surface and a second surface opposite to the first surface, the first surface being level with the front surface of the first epitaxial layer; an epitaxial layer of a second conductivity type opposite to the first conductivity type, the epitaxial layer surrounding sidewalls and the second surface of the DTI.

Some embodiments of the present disclosure provide a method of fabricating a single photon avalanche diode (SPAD) image sensor. The method includes: providing a substrate of a first conductivity type, the substrate having a front surface and a back surface; forming a recess at the front surface of the substrate; forming an epitaxial layer of a second conductivity type opposite to the first conductivity type on exposed sidewalls and a bottom of the recess; filling the recess with a dielectric material; and performing ion implantation to form an implant region of the first conductivity type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A single photon avalanche diode (SPAD) image sensor, comprising:

a substrate of a first conductivity type, the substrate having a front surface and a back surface, the back surface being for receiving incident light;

an inter-layer dielectric (ILD) layer on the front surface of the substrate, the ILD layer including a plurality of metal layers;

a lens at the back surface of the substrate;

a deep trench isolation (DTI) extending from the front surface toward the back surface of the substrate, the DTI having a first surface and a second surface opposite to the first surface, the first surface being level with the front surface of the substrate, the DTI being a solid dielectric pillar, and a center of the lens overlapping a center of the DTI from a top view;

an epitaxial layer of a second conductivity type opposite to the first conductivity type, the epitaxial layer surrounding sidewalls and the second surface of the DTI; and an implant region of the first conductivity type extending from the front surface to the back surface of the substrate and reaching the back surface of the substrate, wherein the implant region is distanced from the epitaxial layer.

2. The SPAD image sensor of claim 1, wherein the DTI is a uniform dielectric material, and the substrate includes a first layer at the front surface and a second layer at the back surface, and a dopant concentration of the first conductivity type of the first layer is higher than a dopant concentration of the first conductivity type of the second layer, and the implant region is between adjacent pixels for isolating the adjacent pixels.

3. The SPAD image sensor of claim 2, wherein the DTI extends from the first layer to the second layer, and the DTI stops before reaching the back surface.

4. The SPAD image sensor of claim 3, wherein the epitaxial layer includes a first portion and a second portion in the first layer and the second layer respectively, and a dopant concentration of the second conductivity type of the first portion is substantially uniform, and a dopant concentration of the second conductivity type of the second portion decreases from an interface between the first portion and the second portion toward the second surface of the DTI.

5. The SPAD image sensor of claim 1, further comprising a heavily doped region of the second conductivity type abutting the epitaxial layer and the front surface of the substrate.

6. The SPAD image sensor of claim 1, further comprising a heavily doped region of the first conductivity type in the implant region abutting the front surface of the substrate.

7. The SPAD image sensor of claim 5, wherein the substrate includes a first layer at the front surface, a third layer at the back surface and a second layer between the first and third layer, and a dopant concentration of the first conductivity type of the second layer is higher than a dopant concentration of the first conductivity type of the first layer and the third layer.

8. The SPAD image sensor of claim 7, wherein the heavily doped region is in the third layer.

9. The SPAD image sensor of claim 1, wherein a top metal layer of the plurality of metal layers in the ILD layer has an upper surface aligned with an upper surface of the ILD layer, wherein the upper surface of the ILD layer faces away from the substrate.

10. A single photon avalanche diode (SPAD) image sensor, comprising:

a first epitaxial layer of a first conductivity type, the first epitaxial layer having a front surface and a back surface;

a second epitaxial layer of the first conductivity type, the second epitaxial layer having a front surface and a back surface, the second epitaxial layer being formed over the first epitaxial layer with the front surface of the second epitaxial layer facing the back surface of the first epitaxial layer, a dopant concentration of the first conductivity type of the first epitaxial layer is higher than a dopant concentration of the first conductivity type of the second epitaxial layer, the back surface of the second epitaxial layer being for receiving incident light;

a deep trench isolation (DTI) extending from the front surface of the first epitaxial layer toward the back surface of the second epitaxial layer, the DTI having a first surface and a second surface opposite to the first surface, the first surface being level with the front surface of the first epitaxial layer, and the DTI being a solid dielectric pillar;

a first inter-layer dielectric (ILD) layer on the front surface of the first epitaxial layer, the first ILD layer including a plurality of metal layers;

a lens at the back surface of the second epitaxial layer, and a center of the lens overlapping a center of the DTI from a top view;

an epitaxial layer of a second conductivity type opposite to the first conductivity type, the epitaxial layer surrounding sidewalls and the second surface of the DTI; and an implant region of the first conductivity type extending from the front surface of the first epitaxial layer to the back surface of the second epitaxial layer and reaching the back surface of the second epitaxial layer, wherein the implant region is distanced from the epitaxial layer.

11. The SPAD image sensor of claim 10, wherein the DTI is a uniform dielectric material, and a dopant concentration of the first conductivity type of the implant region is greater or equal to the dopant concentration of the first conductivity type of the first epitaxial layer, and the implant region is between adjacent pixels for isolating the adjacent pixels.

12. The SPAD image sensor of claim 10, wherein the DTI stops before reaching the back surface of the second epitaxial layer.

13. The SPAD image sensor of claim 10, wherein the epitaxial layer includes a first portion and a second portion in the first layer and the second layer respectively, and a dopant concentration of the second conductivity type of the first portion is substantially uniform, and a dopant concentration of the second conductivity type of the second portion gradually decreases from an interface between the first portion and the second portion toward the second surface of the DTI.

14. The SPAD image sensor of claim 10, further comprising a chip, the chip including a plurality of active devices and a second ILD layer bonded to the first ILD layer, wherein the second ILD layer includes a plurality of metal layers, and a top metal layer in the second ILD layer is bonded to the top metal layer of the first ILD layer.

15. The SPAD image sensor of claim 10, further comprising a carrier bonded to the first ILD layer.

16. A single photon avalanche diode (SPAD) image sensor, comprising:

a substrate of a first conductivity type, the substrate having a front surface and a back surface, the back surface being for receiving incident light;

an inter-layer dielectric (ILD) layer on the front surface of the substrate, the ILD layer including a plurality of metal layers;

a lens at the back surface of the substrate;

a deep trench isolation (DTI) extending from the front surface toward the back surface of the substrate and without reaching the back surface, the DTI having a first surface and a second surface opposite to the first surface, the first surface being level with the front surface of the substrate, the DTI being a solid dielectric pillar, and a center of the lens overlapping a center of the DTI from a top view; and an epitaxial layer of a second conductivity type opposite to the first conductivity type, the epitaxial layer surrounding sidewalls and the second surface of the DTI, wherein the epitaxial layer includes a first portion and a second portion, and a dopant concentration of the second conductivity type of the first portion is substantially uniform, and a dopant concentration of the second conductivity type of the second portion decreases from an interface between the first portion and the second portion toward the second surface of the DTI; and an implant region of the first conductivity type between adjacent pixels of the SPAD image sensor for isolating the adjacent pixels, wherein the implant region is distanced from the epitaxial layer.

17. The SPAD image sensor of claim 16, wherein the DTI is a uniform dielectric material, and the SPAD image sensor further comprises an implant region of the first conductivity type extending from the front surface to the back surface of the substrate and reaching the back surface of the substrate.

18. The SPAD image sensor of claim 16, wherein the substrate includes a first layer at the front surface and a second layer at the back surface, and a dopant concentration of the first conductivity type of the first layer is higher than a dopant concentration of the first conductivity type of the second layer.

19. The SPAD image sensor of claim 18, wherein the DTI extends from the first layer to the second layer, and the DTI stops before reaching the back surface.

20. The SPAD image sensor of claim 16, further comprising a heavily doped region of the second conductivity type abutting the epitaxial layer and the front surface of the substrate.

* * * * *